US007817628B2

(12) United States Patent
Pelletier et al.

(10) Patent No.: US 7,817,628 B2
(45) Date of Patent: Oct. 19, 2010

(54) METHOD AND APPARATUS FOR HEADER COMPRESSION WITH TRANSMISSION OF CONTEXT INFORMATION DEPENDENT UPON MEDIA CHARACTERISTIC

(75) Inventors: Ghyslain Pelletier, Luleå (SE); Uwe Horn, Aachen (DE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 1448 days.

(21) Appl. No.: 10/987,219

(22) Filed: Nov. 15, 2004

(65) Prior Publication Data

US 2006/0104266 A1    May 18, 2006

(51) Int. Cl.
   *H04L 12/56* (2006.01)
(52) U.S. Cl. .................. 370/389; 370/465; 370/474
(58) Field of Classification Search .......... None
   See application file for complete search history.

(56) References Cited

U.S. PATENT DOCUMENTS

| 6,879,266 | B1 | 4/2005 | Dye et al. | |
|---|---|---|---|---|
| 6,882,637 | B1 | 4/2005 | Le et al. | |
| 7,129,860 | B2 | 10/2006 | Alvarez et al. | |
| 7,290,063 | B2 | 10/2007 | Kalliokulju et al. | |
| 2002/0038385 | A1 | 3/2002 | Kalliokulju | |
| 2002/0091860 | A1* | 7/2002 | Kalliokulju et al. | 709/247 |
| 2002/0093938 | A1 | 7/2002 | Tourunen | |
| 2002/0097723 | A1 | 7/2002 | Tourunen et al. | |
| 2003/0007512 | A1 | 1/2003 | Tourunen et al. | |
| 2003/0009663 | A1* | 1/2003 | Pelletier et al. | 713/160 |
| 2004/0185860 | A1 | 9/2004 | Marjelund et al. | |
| 2005/0090273 | A1* | 4/2005 | Jin et al. | 455/502 |
| 2006/0056455 | A1* | 3/2006 | Floriach et al. | 370/469 |

FOREIGN PATENT DOCUMENTS

WO    05/076562 A1    8/2005

OTHER PUBLICATIONS

Bormann et al.."Robust Header Compression (ROHC): Framework and four profiles: RTP, UDP, ESP, and uncompressed" (RFC 3095) ;Jul. 2001; p. 20-24 and 55-57.*

(Continued)

*Primary Examiner*—Chirag G Shah
*Assistant Examiner*—Salvador E Rivas
(74) *Attorney, Agent, or Firm*—Nixon & Vanderhye, P.C.

(57) ABSTRACT

A compressor (25) serves to compress headers of media packets and sends context information to a decompressor (60) for use by the decompressor in decompressing compressed headers (26) of the media packets. With regard to a flow (56) of the media packets from the compressor (25) to the decompressor (60), the compressor (60) controls inclusion of the context information in the flow in accordance with a media characteristic of the media packets. For example, in an illustrative, non-limiting illustration, a context transmission controller (46) of the compressor controls timing of generation of packets which include the context information in accordance with the media characteristic of the media packets. In one mode of operation, the predetermined characteristic which causes inclusion of the context information is media codec access information included in a payload of a packet. Upon detection of the media codec access information, the compressor includes static parameters for a compression context in the context information. In another mode of operation, the predetermined characteristic can be a type of media frame included in a payload of a packet whose header is to be compressed, e.g., an independently encoded media frame, wherein the detection of the independently encoded media frame prompts inclusion of dynamic parameters for the compression context.

23 Claims, 10 Drawing Sheets

OTHER PUBLICATIONS

"Broadcast/Multicast Services—Stage 1", Revision A, 3GPP2 S.P0030-A Version 0.4.3, Jun. 12, 2003.

"Broadcast-Multicast Service (BCMCS) Framework Draft Document", Version 1.2, 3GPP2 BCMCS ad-hoc group, May 2003.

"Header Compression for BCMCS", Haipeng Jin and Jun Wang, QUALCOMM Incorporated, contribution to 3GPP2 BCMCS ad-hoc group, Oct. 2003.

3GPP TS 23.107 V5.10.0 (Sep. 2003), TSG SA; Quality of Service (QoS) concept and architecture.

3GPP TS 43.246 V0.6.0 (Jul. 2003), TSG GERAN; Multimedia Broadcast Multicast Service (MBMS) in the GERAN.

Van Jacobson. *Compressing TCP/IP Headers for Low-Speed Serial Links*. IETF RFC 1144, IETF Network Working Group, Feb. 1990.

Mikael Degermark, Björn Nordgren, Stephen Pink. *IP Header Compression*. IETF RFC 2507, IETF Network Working Group, Feb. 1999.

Steven Casner, Van Jacobson. *Compressing IP/UDP/RTP Headers for Low-Speed Serial Links*. IETF RFC 2508, IETF Network Working Group, Feb. 1999.

Koren, T., Casner, S., Geevarghese, J., Thompson B. and P. Ruddy, *Enhanced Compressed RTP (CRTP) for Links with High Delay, Packet Loss and Reordering*. IETF RFC 3545, IETF Network Working Group, Jul. 2003.

Carsten Bormann, et al. *RObust Header Compression (ROHC): Framework and four profiles: RTP, UDP, ESP and uncompressed.* IETF RFC 3095, Jul. 2001.

Jonsson, L. and G. Pelletier, *RObust Header Cmpression (ROHC): A Link-Layer Assisted ROHC Profile for IP/UDP/RTP*. IETF RFC 3242, Apr. 2002.

Liu, Z and K. Le, *Zero-byte Support for Bidirectional Reliable Mode (R-mode) in Extended Link-Layer Assisted RObust Header Compression (ROHC) Profile*, IETF RFC 3408, Dec. 2002.

Jonsson, L. and G. Pelletier, *RObust Header Compression (ROHC): A compression profile for IP*, Internet draft (work in progress), <draft-ietf-rohc-ip-only-05.txt>, Oct. 2003.

Pelletier, G., Jonsson, L., West, M. and R. Price *RObust Header Compression (ROHC): TCP/IP Profile (ROHC-TCP)*, Internet Draft (work in progress), <draft-ietf-rohc-tcp-05.txt>, Oct. 2003.

Pelletier, G., *RObust Header Compression (ROHC): Profiles for UDP-Lite*, Internet Draft (work in progress), <draft-ietf-rohc-udp-lite-02.txt>, Dec. 2003.

Pelletier, G., *Robust Header Compression (ROHC): Context replication for ROHC profiles*, Internet Draft (work in progress), <draft-ietf-rohc-context-replication-01.txt>, Oct. 2003.

Bormann, C., *Robust Header Compression (ROHC) over PPP*, IETF RFC 3241, Apr. 2002.

Kikuchi et al, *RTP Payload Format for MPEG-4 Audio/Visual Streams*, Standards Track, RFC 3016, Nov. 2000.

International Search Report and Written Opinion mailed Mar. 15, 2006 in corresponding PCT application No. PCT/SE2005/001624.

Final Office Action mailed Sep. 1, 2009 in co-pending U.S. Appl. No. 10/987,218.

* cited by examiner

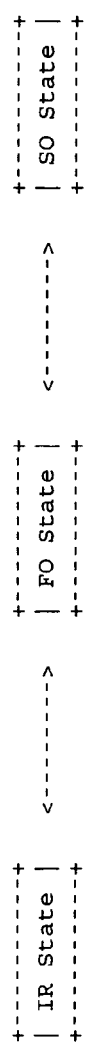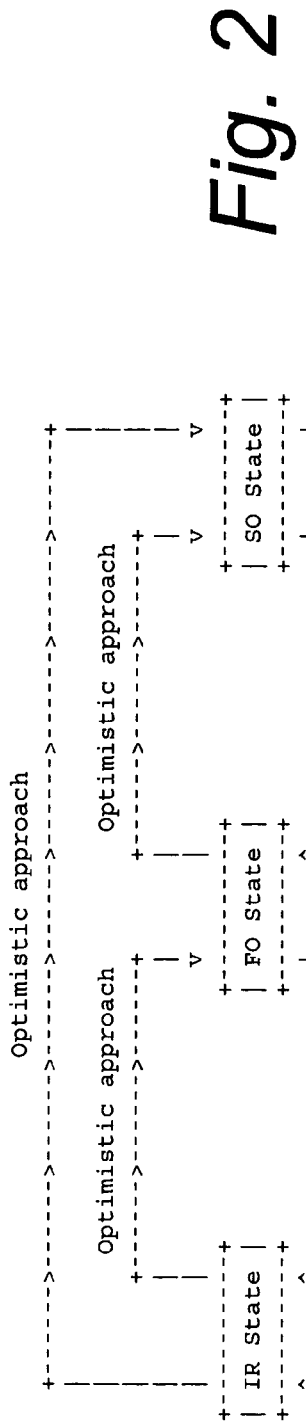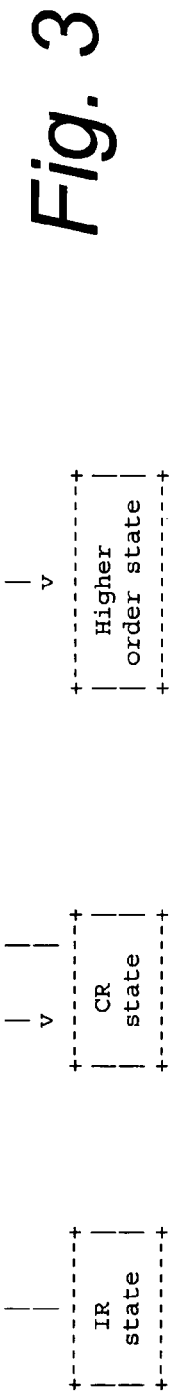

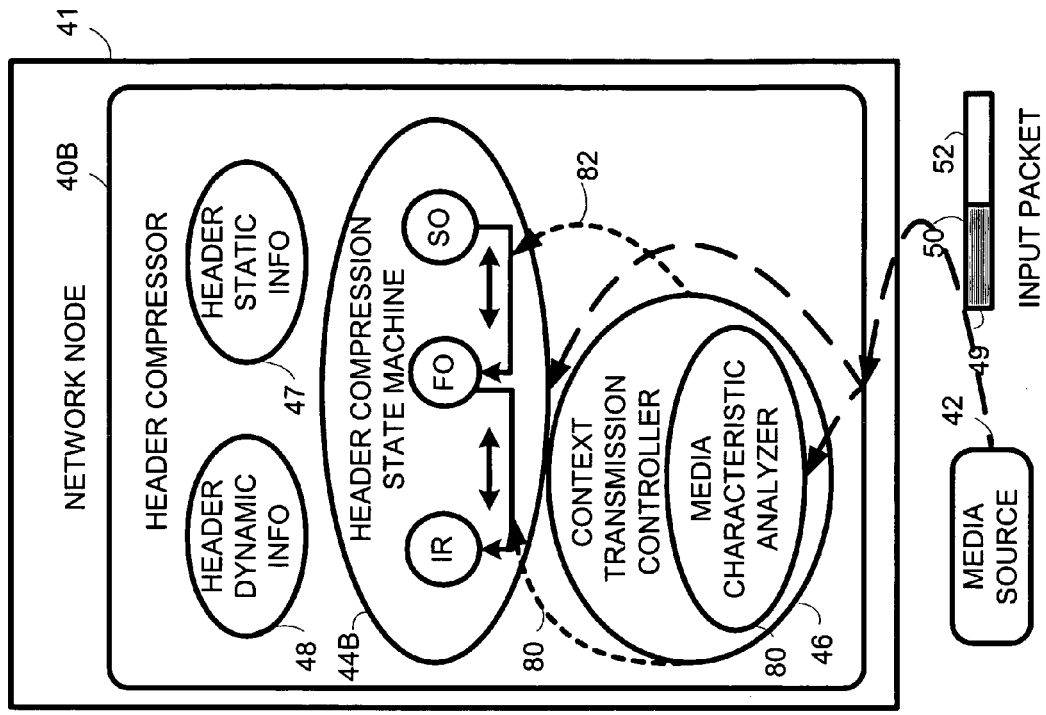

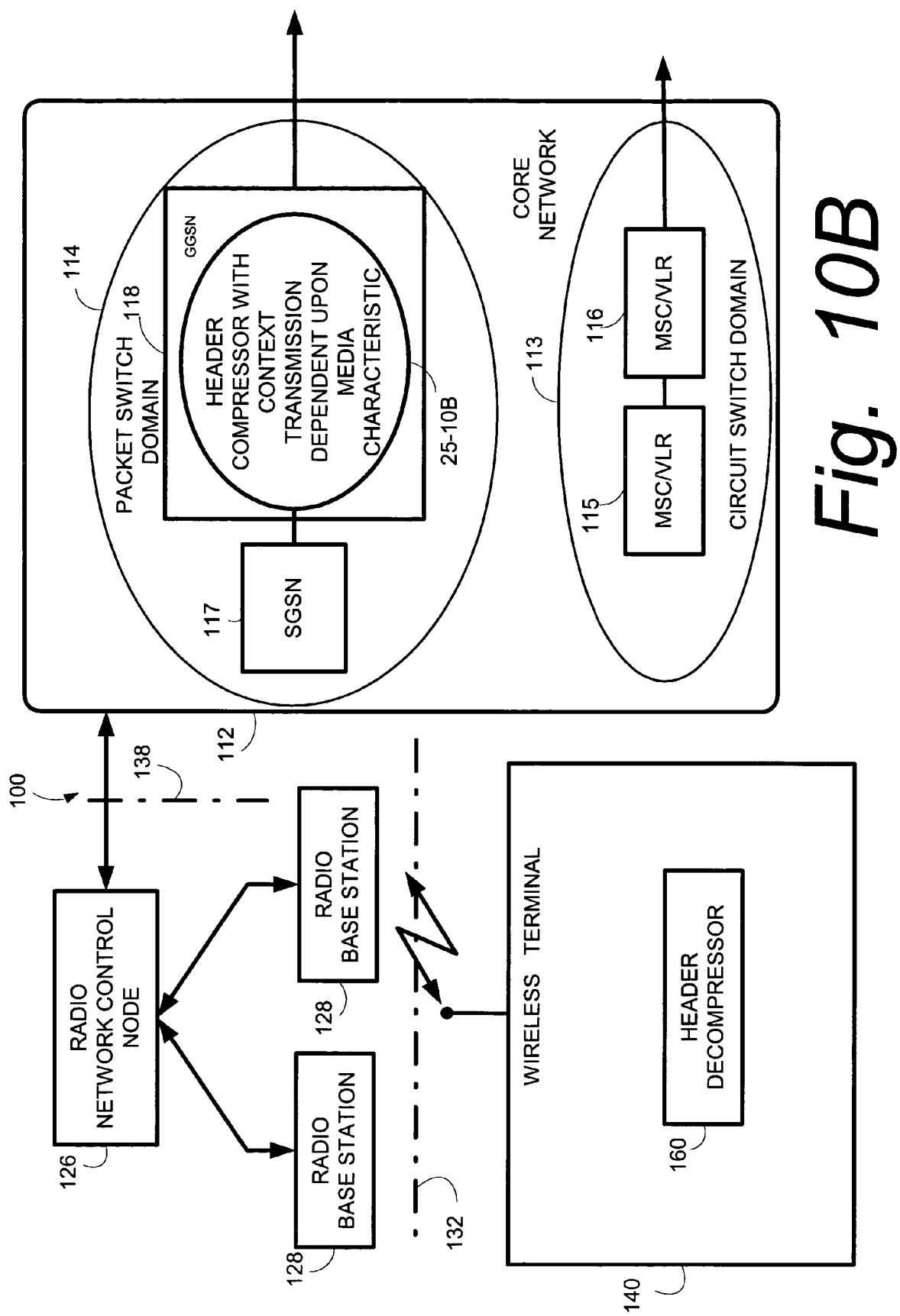

METHOD AND APPARATUS FOR HEADER COMPRESSION WITH TRANSMISSION OF CONTEXT INFORMATION DEPENDENT UPON MEDIA CHARACTERISTIC

BACKGROUND

1. Field of the Invention

The present invention pertains generally to telecommunications, and particularly to the compression of headers of packets such as media packets.

2. Related Art and Other Considerations

Due to the tremendous success of the Internet, it has become a challenging task to make use of the Internet Protocol (IP) over all kinds of links. However, because of the fact that the headers of the IP protocols are rather large, it is not always a simple task to make this come true for narrowband links, such as cellular links, for example. As an example, consider ordinary speech data transported by the protocols (IP, UDP, RTP) used for Voice-over-IP (VoIP), where the header may represent about 70% of the packet resulting in a very inefficient usage of the link.

The term "header compression" (HC) encompasses the art of minimizing the necessary bandwidth for information carried in headers on a per-hop basis over point-to-point links. Header compression techniques in general have a more than ten-year-old history within the Internet community. Several commonly used header compression protocols exist, such as the following: (1) Van Jacobson. *Compressing TCP/IP Headers for Low-Speed Serial Links*. IETF RFC 1144, IETF Network Working Group, February 1990; (2) Mikael Degermark, Björn Nordgren, Stephen Pink. *IP Header Compression*, IETF RFC 2507, IETF Network Working Group, February 1999; and (3) Steven Casner, Van Jacobson. *Compressing IP/UDP/RTP Headers for Low-Speed Serial Links*, IETF RFC 2508, IETF Network Working Group, February 1999, all of which are incorporated by reference herein in their entirety.

Header compression takes advantage of the fact that some fields in the headers are not changing within a flow, or change with small and/or predictable values. Header compression schemes make use of these characteristics and send static information only initially, while changing fields are sent with their absolute values or as differences from packet to packet. Completely random information has to be sent without any compression at all.

Header compression is thus an important component to make IP services over wireless, such as voice and video services, economically feasible. Header compression solutions have been developed by the Robust Header Compression (ROHC) Working Group of the Internet Engineering Task Force (IETF) to improve the efficiency of such services.

Robust Header Compression (ROHC), as defined in RFC 3095 (Bormann, C., "RObust Header Compression (ROHC): Framework and four profiles: RTP, UDP, ESP, and uncompressed", RFC 3095, Internet Engineering Task Force, July 2001), is an extensible framework for which profiles for compression of various protocols may be defined. For real-time multimedia services (e.g. voice, video), the application data is transported end-to-end within an IP/UDP/RTP stream. Header compression of IP/UDP/RTP is defined by the ROHC profile 0x0001 (ROHC RTP) and is applicable for Voice-over-IP (VoIP) services among others. The ROHC RTP header compression scheme has been designed to efficiently compress the IP/UDP/RTP headers over an arbitrary link layer.

A number of other ROHC profiles have also been defined for compression. Among these are (1) IP/UDP/RTP headers (described in: Jonsson, L. and G. Pelletier, *RObust Header Compression (ROHC): A Link-Layer Assisted ROHC Profile for IP/UDP/RTP*, IETF RFC 3242, April 2002; and Liu, Z and K. Le, *Zero-byte Support for Bidirectional Reliable Mode (R-mode) in Extended Link-Layer Assisted RObust Header Compression (ROHC) Profile*, IETF RFC 3408, December 2002); (2) IP only headers (described in: Jonsson, L. and G. Pelletier, *RObust Header Compression (ROHC): A compression profile for IP*, IETF RFC 3843, June 2004; (3) IP/TCP headers (described in: Pelletier, G., Jonsson, L., West, M. and R. Price *RObust Header Compression (ROHC): TCP/IP Profile (ROHC-TCP)*, Internet Draft (work in progress), <draft-ietf-rohc-tcp-08.txt>, October 2004); and (4) IP/UDP-Lite/RTP headers (described in: Pelletier, G., *RObust Header Compression (ROHC): Profiles for UDP-Lite*, Internet Draft (work in progress), <draft-ietf-rohc-udp-lite-04.txt>, June 2004). All RFCs cited herein are incorporated by reference herein in their entireties.

Except for negotiation (see also Bormann, C., *Robust Header Compression (ROHC) over PPP*, IETF RFC 3241, April 2002), ROHC profiles only requires framing and error detection to be provided by the link layer, while all other functionality is handled by the ROHC scheme itself.

The ROHC profiles defined in RFC 3095, RFC 3242, RFC 3408, "IP-ONLY" (Jonsson, L. and G. Pelletier, *RObust Header Compression (ROHC): A compression profile for IP*, IETF RFC 3843, June 2004, and "ROHC-UDPLite" (Pelletier, G., *RObust Header Compression (ROHC): Profiles for UDP-Lite*, Internet Draft (work in progress), <draft-ietf-rohc-udp-lite-04.txt>, June 2004) all support three different modes of operation. In short, for a specific context, the mode of operation controls the actions and the logic to perform as well as the packet types to use during different states of the header compression operation. Packet types and formats that are allowed may vary from one mode to the other. The Unidirectional mode (U-mode) is used at the beginning of any ROHC compression before any transition to other modes may occur. The Bidirectional Optimistic mode (O-mode) seeks to maximize the compression efficiency and sparse usage of the feedback channel. The Bidirectional Reliable mode (R-mode) seeks to maximize robustness against loss propagation and context damage propagation.

When in U-mode, packets are sent from compressor to decompressor only. The U-mode is thus usable over links where a return path from decompressor to compressor is either not desired or not available. Periodical refreshes are used in U-mode. The U-mode is particularly applicable to broadcast or multicast channels.

The O-mode is similar to the U-mode with the difference that a feedback channel is used to send error recovery requests and (optionally) acknowledgements of significant context updates from the decompressor to compressor. For most ROHC profiles, the U-mode and the O-mode are often indistinctly referred to using the term U/O-mode, due their rather similar characteristics—such as an identical set of packets formats for both modes.

The R-mode differs significantly from the two other modes, mainly by making a more extensive usage of the feedback channel and a stricter logic for performing context updates. The R-mode also uses a few different packet types only understood and useful in this mode.

Each mode of operation has different properties in terms of compression efficiency, robustness and processing complexity. Mode transitions may only be initiated by the decompressor. ROHC does not specify how and when each mode should be used (other than that ROHC compression must always start in U-mode). Therefore, the logic for mode transitions is an implementation decision and may be based on measurements of the link characteristics, link conditions, implementation optimizations for a specific mode or may be based on other algorithms. In particular, for Broadcast/Multicast type of services, header compression operates in the unidirectional mode (U-Mode) only, as normally for such services a feedback channel from decompressor to compressor is not available or desired.

A header compression scheme (such as a ROHC Profile) can be conceptualized and/or realized as a state machine. A challenging task is to keep the compressor and decompressor states, called contexts, consistent with each other, while keeping the header overhead as low as possible. There is one state machine for the compressor, and one state machine for the decompressor. The compressor state machine directly impacts the level of compression efficiency, as it is an important part of the logic controlling the choice of compressed packet type to be sent. The purpose of the decompressor state machine is mainly to provide the logic for feedback (if applicable) and to identify the packet types for which decompression may be attempted.

A compression context contains and maintains relevant information about past packets, and this information is used to compress and decompress subsequent packets. As explained in the ROHC documentation, the context of the compressor is the state it uses to compress a header. The context of the decompressor is the state it uses to decompress a header. Either of these or the two in combination are usually referred to as "context", when it is clear which is intended. The context contains relevant information from previous headers in the packet stream, such as static fields and possible reference values for compression and decompression. Moreover, additional information describing the packet stream is also part of the context, for example information about how the IP Identifier field changes and the typical inter-packet increase in sequence numbers or timestamps.

For the ROHC profiles defined in RFC 3095, RFC 3242, RFC 3408, "IP-ONLY" (Jonsson, L. and G. Pelletier, *RObust Header Compression (ROHC): A compression profile for IP*, IETF RFC 3843, June 2004) and "ROHC-UDPLite" (Pelletier, G., RObust Header Compression (ROHC): Profiles for UDP-Lite, Internet Draft (work in progress), <draft-ietf-rohc-udp-lite-04.txt>, June 2004), FIG. 1 shows the compressor state machine. For ROHC compression, the three compressor states are the Initialization and Refresh (IR), First Order (FO), and Second Order (SO) states. The compressor starts in the lowest compression state (IR) and transits gradually to higher compression states. The compressor will always operate in the highest possible compression state, under the constraint that the compressor is sufficiently confident that the decompressor has the information necessary to decompress a header compressed according to that state. See, e.g., RFC 3095, section 4.3.1 (Carsten Bormann, et al. *RObust Header Compression (ROHC): Framework and four profiles: RTP, UDP, ESP and uncompressed*; IETF RFC 3095, April 2001). In particular while operating in U-Mode, decisions about transitions between the various compression states are normally taken by the compressor on the basis of variations in packet headers and periodic timeouts.

According to RFC 3095 defines the Initialization and Refresh (IR) State, in section 4.3.1, the purpose of the IR state is to initialize the static parts of the context at the decompressor or to recover after failure. In this state, the compressor sends complete header information. This includes all static and nonstatic fields in uncompressed form plus some additional information. The compressor stays in the IR state until it is fairly confident that the decompressor has received the static information correctly.

The IR state is thus the state were the compression level is the lowest. FIG. 2, taken from RFC 3095, section 5.3.1, describes the U-Mode state machine. In the U-mode state machine of FIG. 2, Timeout_1 typically corresponds to a periodic sending of the static (and possibly also dynamic) parameters of the decompressor context, while Timeout_2 typically corresponds to a periodic sending of only the dynamic parameters of the decompressor context.

In addition, the context replication (CR) mechanism for ROHC profiles introduce an additional state, the CR state. See, Pelletier, G., *Robust Header Compression (ROHC): Context replication for ROHC profiles*, Internet Draft (work in progress), <draft-ietf-rohc-context-replication-01.txt>, October 2003. Todate, only the [ROHC-TCP] profile specifies support for context replication, but other profiles may also support it provided their corresponding standard is updated. The CR state may also be used by a profile operating in U-Mode. FIG. 3 shows the logic added to the previous state machine for the CR state. In U-Mode, downward transitions are performed according to the same logic as described above.

FIG. 4, taken from RFC 3095, section 5.3.2, illustrates an example U-Mode decompressor state machine. The state of the decompressor dictates what type of compressed packet may be decompressed. In the No Context (NC) state, only packets initializing the static part may be decompressed (e.g. ROHC IR packets). In the Static Context (SC) state, only packets containing sufficient information on the dynamic parameters (e.g. ROHC IR-DYN or UOR-2 packets) may be decompressed. In the Full Context (FC) state, any packet may be decompressed. Thus, depending on the condition of the channel and on the success rate of the decompression, the decompressor state machine will transit between the different states and will have to wait for the reception of a suitable packet for attempting decompression.

In unidirectional operation, there is no feedback sent back to the compressor. Therefore, in unidirection operation, the decompressor may (in the worst cases) have up to Timeout_1 of waiting time without possibility to start decompression of the received packets, and up to Timeout_2 before it can re-start compression after severe context damage to the dynamic information.

Broadcast and multicast services differ from unicast services in that they do not specifically target a single receiver, but are rather forms of transmission where multiple recipients will receive the service. Unicast transmits to an address (either network or link-layer address) corresponding to one and only one receiver. Broadcast and multicast, on the other hand, use addresses shared by a number, or a group, of receivers. A broadcast is generally a transmission that can be received by anyone who can tune to the channel, while multicast is a transmission between a sender and multiple specific receivers on a network.

Of particular interest for such services is the robustness characteristics of the header compression scheme over a channel with relatively high bit error rates, with no or limited link retransmissions and with no or limited feedback capability. With respect to this, ROHC U-mode has a clear advantage when compared to other existing header compression schemes such as RFC 2508 and RFC 3545 (Koren, T., Casner, S., Geevarghese, J., Thompson B. and P. Ruddy, *Enhanced Compressed RTP (CRTP) for Links with High Delay, Packet Loss and Reordering*, IETF RFC 3545, IETF Network Working Group, July 2003).

The 3GPP2 BCMCS Framework ("*Broadcast-Multicast Service (BCMCS) Framework Draft Document*", Version 1.2, 3GPP2 BCMCS ad-hoc group, May 2003) provides an architectural overview and a framework description of the Broadcast-Multicast Service (BCMCS) for the cdma2000® networks (cdma2000® is a registered trademark of the telecommunications Industry Association (TIA—USA)). Similarly to the BCMCS work item in 3GPP2, MBMS (Multicast/Broadcast Multimedia System) is currently part of the Release 6 "Introduction of the Multimedia Broadcast Multicast Service (MBMS) in GERAN" work item within 3GPP standardization. In the standard, an MBMS radio bearer is defined as either "point-to-point" (p-t-p) or "point-to-multipoint" (p-t-m). Also, an MBMS channel is defined to comprise the physical resources assigned to one or more MBMS services. MBMS channels carry either an MBMS p-t-p radio bearer or an MBMS p-t-m radio bearer. It is foreseeable that MBMS will also use IP header compression (with ROHC) in the same manner as 3GPP2's BCMCS. These standardization efforts strive to allow optimization of the use of the existing radio interfaces for delivery of broadcast/multicast content stream(s) to one or more terminals in one or more regions of an operator's network.

There are alternative proposals for improving BCMCS access [QC-ROHC]. For cdma2000® networks, a Qualcomm proposal, abbreviated as "QC-ROHC" advocates the use of ROHC in unidirectional mode as the preferred header compression algorithm for BCMCS services, but with modifications to the ROHC unidirectional mode of operation for header compression in BCMCS. See, "*Header Compression for BCMCS*", Haipeng Jin and Jun Wang, QUALCOMM Incorporated, contribution to 3GPP2 BCMCS ad-hoc group, October 2003. The QC-ROHC proposal claims that the existing unidirectional mode of operation in ROHC does not work efficiently enough when used over broadcast links with significant error rates and scarce bandwidth. QC-ROHC proposes that static context information be sent in advance to the decompressor via BCMCS information acquisition, on a separate channel. Thus, QC-ROHC proposes to entirely disable the ROHC IR state when operating in U-mode in BCMCS services, and to send the IR parameters out-of-band instead—only once during channel information acquisition. If a decompressor requires the static part of the context, the mobile terminal should initiate a new registration to the service to trigger a new channel information acquisition exchange.

The QC-ROHC proposal thus requires significant changes to the state machine logic, as well as an unnecessarily complex interaction between the header compression algorithm and the underlying system. Also, QC-ROHC is limited to one IP multicast/broadcast flow per ROHC instance (ROHC channel). This can pose unnecessary constraints on the processing and memory usage required in the terminal. Moreover, QC-ROHC may not be suitable for 3GPP's MBMS framework and architecture, as access to the MBMS service may differ fundamentally. Simpler approaches would be preferable, in particular those approaches that may improve the access to the service without bringing additional constraints to the system.

A service called Push to Talk over Cellular or Instant-Talk-over-Cellular (PoC) will likely be applied in handsets for GSM, EDGE, UMTS and CDMA systems. Push to talk over Cellular (PoC) is currently being standardized and agreed upon in an industry consortium known as the Open Mobile Alliance (OMA) forum. See, e.g., http://www.openmobilealliance.com/tech/wg_committees/poc.htm. PoC is basically a voice chat for cellular telecommunication systems. PoC provides quick one-to-one or group communication, providing something like a short instant messaging service which feels like "walkie talkies". PoC enabled handsets will most likely be equipped with a PoC button (hardware or software). When this button is pressed, the handset is connected directly to a friend, a family member, or even a whole group of people, one-to-one or one-to many. Like a "walkie-talkie" the PoC service is half-duplex, although full duplex may be available at a later stage. It is important to have low setup delay in order to allow for the user to start speak immediately after pressing the button. It is also important that the PoC service be supported in an efficient manner in the radio network since it is expected to be cheaper than circuit switched voice, and since it is likely to become a mass-market service with high penetration.

A typical usage of PoC is for a group of persons (e.g. youths, or professional workers at a building site) use the PoC terminals to keep the group updated on what is on-going. The group participants may be geographically co-located, for example. Current non-PoC systems use one dedicated radio channel (and core network) resource per group participant, which obviously is costly in terms of both radio and core network resources. It is thus foreseeable that the PoC or comparable service may be used over a multicast service.

When operating in U-Mode, efficiency and delay to decompressor full context (i.e. a part of the access to the channel) is limited in view of the tradeoff between (1) the frequency of context updates (e.g. compressor downward transitions) for the purpose of maintaining synchronized contexts at both ends of the link; and (2) the time for a decompressor having no suitable context to (re)synchronize with the compressor context (e.g. when acquiring the broadcast/multicast channel or after a burst of errors leading to damage to the dynamic part of the context).

The context initialization phase (IR state) normally requires the compressor to start using the lowest compression state. Initially, the transmitted packets contain the information necessary to initialize at least the static part, and can also include the dynamic part of the context.

The compressor must then have enough confidence that the decompressor has the proper context before a transition to a higher compression ratio takes place. This confidence may be achieved in U-mode by sending a number of context initialization packets repeatedly for a large enough interval (an optimistic approach). The use of a number of packets may achieve confidence in less than one round trip time (RTT) but cannot absolutely guarantee that the decompressor does have the proper context other than optimistically expect to be successful with a high percentage rate.

In addition, to ensure robustness, a compressor operating in U-mode periodically transits back to a lower compression state (e.g. to IR state with period Timeout_1, or to FO state with period Timeout_2). Transition back to a higher compression state then follows the optimistic approach similarly to the context initialization procedure.

With respect to ROHC U-mode, the periodical refreshes can be seen as two independent processes, namely context initialization and context refreshes. In context initialization, the information conveyed contains both static and dynamic header information (e.g. ROHC IR packets). In context refreshes, the information sent to the compressor comprises dynamic header information (e.g. ROHC IR-DYN packets), or contains both static and dynamic header information (e.g. ROHC IR packets).

The periodical context refreshes can be further separated based on static fields and dynamic fields. For static fields, the periodical updating of this information is performed less often, and is mainly for initializing an un-initialized context rather than for "refreshing" information being static (e.g. ROHC IR packets sent with period Timeout_1). For dynamic fields, the periodical updating is performed more frequently, and is mainly useful to provide means for the decompressor to recover from severe context damage (e.g. ROHC IR-DYN packets sent with period Timeout_2, ROHC IR packets may also be used).

More specifically for the ROHC framework [ROHC], context initialization requires the compressor to start using the lowest compression state, the Initialization and Refresh (IR state). The first transmitted packets are IR packets to initialize at least the static part (and maybe also the dynamic part) of the context. The static part may include information such as Context Identifier (CID), compression profile, the IP source and destination addresses, the UDP source and destination ports, SSRC etc. The dynamic part includes information such as RTP sequence number (RTP SN), payload type, timestamps, timestamp stride etc.

The ROHC framework requires that initialization first use a number of IR packets, and then possibly followed by a number of IR-DYN (IR-dynamic) packets. The size of these packet types, excluding the payload bits, is in the order of tens of octets.

Initialization and periodic refreshes of a header compression context thus require bandwidth for the bits necessary to be exchanged between compressor and decompressor, and this step is necessary to ensure that higher compression efficiency may be achieved. The confidence from the compressor that the decompressor has achieved proper context implies a certain delay for which the compression efficiency is far from optimal. In some situations, such as real-time VoIP flows over very narrow bandwidth wireless links using 0-byte header compression algorithms, for example, such delay may impact perceived quality until optimal compression efficiency is reached. While the impact for a constant flow is minimal and concealed to the first packets of the flow, it may be more significant for a bursty and discontinuous flow, and should be minimized.

When used over error prone unidirectional links such as wireless broadcast links, a ROHC compressor operating in unidirectional mode (U-mode) faces a trade-off between efficiency and reliability. More specifically, when improving spectral efficiency of header compression operating in a unidirectional mode, both the reliability of the context initialization and the delay to reach the static context state (or full context) at the decompressor must be considered. In other words, two types of delay parameters must be considered. The first type of delay parameter (delay to decompression context initialization) is the delay from the time when the mobile station (MS) joins a service flow on the unidirectional channel (no decompression context exists for that flow) to the time the decompressor in the mobile station (MS) can start decompression (having obtained at least the static context information). The second type of delay parameter (delay to decompressor context repair) is the delay from the time when the decompressor has invalidated the context, or parts of the context, to the time when a packet suitable for re-synchronizing the context is successfully received.

All packets received prior to the time at which the decompressor context is successfully initialized must typically be discarded, leading to a longer access time to the service. When the periodic transition to initialization and refresh (IR) state in the compressor (Timeout_1) is set to a long interval, fewer large IR packets are transmitted, leading to higher bandwidth efficiency. However, the time to initially access the channel and initialize the context for the new flow increases (up to Timeout_1 in the worst case). On the other hand, if the periodic transition to the IR state in the compressor (Timeout_1) is set to happen with a short interval, the decompressor will be able to initialize its context promptly, achieving a lower access time to the service flow. However, the large number of IR/IR-DYN packets sent will lead to lower efficiency.

Since wireless links typically have high error rate, there is a fairly high probability for the transmitted packets to be corrupted and cause repeated decompression failures at the decompressor. Once the decompressor is forced away from Full Context (FC) state by such failures, the decompressor may have to wait for a certain time until it receives the periodic IR or IR-DYN packet(s) from the compressor necessary to re-establish or repair the context. Most or even all packets received during this interval may have to be discarded, causing disruption in the service. Thus, when the periodic transition to First Order (FO) state in the compressor (Timeout_2) is set to a long interval, fewer moderately large IR-DYN (or large IR) packets are transmitted, leading to higher bandwidth efficiency. However, the time to repair a partially damaged context for the flow increases (up to Timeout_2 in the worst case). On the other hand, if the periodic transition to the FO state in the compressor (Timeout_2) is set with a short interval, the decompressor will be able to recover from a loss in dynamic context promptly, achieving higher reliability.

Media is typically provided with media encoding information. As just one illustrative example, consider MPEG video compression. The MPEG-4 Configuration information comprises a Visual Object Sequence Header, a Visual Object Header, and Video Object Layer Header. As stated in RFC 3016: "The Combined Configuration/Elementary stream mode MUST be used so that configuration information will be carried to the same RTP port as the elementary stream (see 6.2.1 "Start codes" of ISO/IEC 14496-2 [2][9][4]) The configuration information MAY additionally be specified by some out-of-band means" (Kikuchi, Y., et al., "RTP Payload Format for MPEG-4 Audio/Visual Streams", RFC 3016, Internet Engineering Task Force, November 2000).

If the first configuration information and/or an intra frame are sent prior to the decompressor having established its context, the header decompressor will discard these frames due to unsuccessful header decompression. The receiver will have to wait for (at least) the next sending of the configuration information and/or an intra frame before it can start rendering the media.

The MPEG encoded video uses three different frame formats: Format I frame (Intra frames), which are coded as a still image, provide random access, and have only moderate compression; Format P frames (predicted frames), which are predicted from the most recently decoded I or P frame; and Format B (bidirectional frames), which provide the highest amount of compression but require the closest two I or P frames for prediction. A lost "I" format frame affects at least a whole group of pictures (GOP), and B frames require an additional P frame to be correctly decoded.

As explained above, there is a trade-off in bandwidth efficiency when frequently sending IR packets. For broadcast/multicast services using ROHC in U-mode, it is desirable to ensure a short access time to the IP service (including fast context initialization) as well as a timely context recovery to prevent additional disruption in the service caused by the header compression algorithm. This should be done while minimizing the overhead introduced by the header compression algorithm, whose purpose is to ensure reliability in the absence of a feedback channel between the decompressor and the compressor.

What is needed, therefore, and an object of the present invention, are method and apparatus for header compression which achieve a suitable balance between bandwidth efficiency and short access/recovery time.

SUMMARY

A compressor serves to compress headers of media packets and sends context information to a decompressor for use by the decompressor in decompressing compressed headers of the media packets. With regard to a flow of the media packets from the compressor to the decompressor, the compressor controls inclusion of the context information in the flow in accordance with a media characteristic of the media packets. For example, in an illustrative, non-limiting illustration, the compressor controls timing of inclusion of context information parameters in packets or in the headers of packets, with the packets (or at least their headers) being a container for the context information, such context information-bearing parameters being generated in accordance with the media characteristic of the media packets.

In one mode of operation, the predetermined characteristic which causes inclusion of the context information is media codec access information included in a payload of a packet whose header is intended to be compressed. Upon detection of the media codec access information, the compressor includes static parameters for a compression context in the context information, e.g., as context information parameters in the header of the packet. Although the header of the packet was intended for compression, as a result of inclusion of the context information the header may not be compressed, or may be only partially compressed.

In another mode of operation, the predetermined characteristic can be a type of media frame included in a payload of a packet, e.g., an independently encoded media frame. Detection of the independently encoded media frame prompts inclusion of dynamic parameters for the compression context.

In an example embodiment, the compressor includes a header compression state machine. The header compression state machine performs transitions among compression states such as the following compression states: an initialization and refresh state; a first order compression state; and, a second order compression state. In addition, the compressor includes a context transmission controller which, with regard to a flow of the media packets, controls inclusion of the context information and thus transition between the compression states in dependence upon a media characteristic of the media packets. In an example embodiment, when the context transmission controller of the compressor detects the predetermined characteristic of a media packet, the compressor generates a packet which includes the context information. In differing embodiments, the packet which includes the context information may or may not be a media packet, i.e., the context information may be included (likely at least partially in uncompressed form) in the header of a media packet or as a separate packet which is introduced at the behest and control of the controller into the flow of media packets. The predetermined characteristic can be a type of media frame (e.g., independently encoded media frame) or media codec access information included in a payload of a packet whose header is to be compressed.

In a mode of operation of the state machine embodiment, when the header compression state machine is in either the first order compression state or the second order state and the context transmission controller detects media codec access information within a payload of a packet, the header compression state machine transitions to the initialization and refresh state and includes at least static (and preferably also dynamic) header information in the context information.

In another mode of operation of the state machine embodiment, when the header compression state machine is in the second order compression state and the context transmission controller detects an independently encoded media frame within a payload of a packet, the header compression state machine transitions to the first order compression state and includes at least dynamic header information in the context information.

Thus, as one of its aspects, the technology concerns a compressor which compresses headers of media packets destined to a decompressor, the compressor comprising a header compression state machine (which transitions between an initialization and refresh state and other states) and a context transmission controller. The context transmission controller governs transition to the initialization and refresh state upon detection of media codec configuration information within a payload of a packet, and preferably only upon detection of media codec configuration information within the payload of the packet. The compressor includes at least static parameters of a compression context in the header of the packet whose payload includes the media codec configuration information.

As another of its aspects, the technology concerns a compressor which compresses headers of media packets destined to a decompressor and which synchronizes a sending to the decompressor of dynamic parameters of a compression context upon detection of a predetermined type of media frame within a payload of a packet. The compressor includes the dynamic parameters of the compression context in the header of the packet whose payload includes the independently encoded media frame.

BRIEF DESCRIPTION OF THE DRAWINGS

The foregoing and other objects, features, and advantages of the invention will be apparent from the following more particular description of preferred embodiments as illustrated in the accompanying drawings in which reference characters refer to the same parts throughout the various views. The drawings are not necessarily to scale, emphasis instead being placed upon illustrating the principles of the invention.

FIG. 1 is a diagrammatic view of an example compressor state machine.

FIG. 2 is a diagrammatic view of an example U-Mode state machine.

FIG. 3 is a diagrammatic view showing logic added to a state machine for the CR state.

FIG. 6A is a diagrammatic view of an example header compressor.

FIG. 6B is a diagrammatic view of an example header compressor which comprises an example state machine.

FIG. 10B is a schematic view of a particular telecommunications system which serves as an example context in which the present invention may be employed, wherein a compressor is included in a Gateway General Packet Radio Service (GPRS) support node (GGSN).

DETAILED DESCRIPTION OF THE DRAWINGS

In the following description, for purposes of explanation and not limitation, specific details are set forth such as particular architectures, interfaces, techniques, etc. in order to provide a thorough understanding of the present invention. However, it will be apparent to those skilled in the art that the present invention may be practiced in other embodiments that depart from these specific details. In other instances, detailed descriptions of well-known devices, circuits, and methods are omitted so as not to obscure the description of the present invention with unnecessary detail.

As explained above, there is a trade-off in bandwidth efficiency when frequently sending IR packets. For broadcast/multicast services using ROHC in U-mode, for example, it is desirable to ensure a short access time to the IP service (including fast context initialization) as well as a timely context recovery to prevent additional disruption in the service caused by the header compression algorithm. This should be done while minimizing the overhead introduced by the header compression algorithm, whose purpose is to ensure reliability in the absence of a feedback channel between the decompressor and the compressor. This can be done either by refreshing very often the context (small Timeout__1 and Timeout__2), or by synchronizing these refreshes with the media characteristics of the service.

For a terminal to access the IP broadcast/multicast service and start rendering the streamed media (audio and/or video) with header compression, three conditions must be fulfilled. The first condition is that the decompressor context must have been initialized, i.e. it must have received all necessary information to properly decompress the received packets. The second condition is that the media decoder must have been initialized, i.e. it must have received all the necessary configuration information (this can be done either in-band with the compressed media, or out-of-band using other mechanisms). The third condition is that at least one independently encoded media frame must have been received, i.e. reference-coded audio and/or video frames are not sufficient to start rendering the media. The combined time that a receiving terminal will wait before receiving a context initialization packet AND the decoder configuration information AND the first independent encoded frame may amount to a large time.

As used herein, an "independent" or independently encoded" is a frame can properly decompressed without having received any other frame. Independently coded frames are frames for which the media is coded based only on a single original frame—e.g. a still image compressed using JPEG or a MPEG-4 I frame. Other frames can be coded based on the independently coded frames, e.g. based on their difference to that frame.

Figure 5:
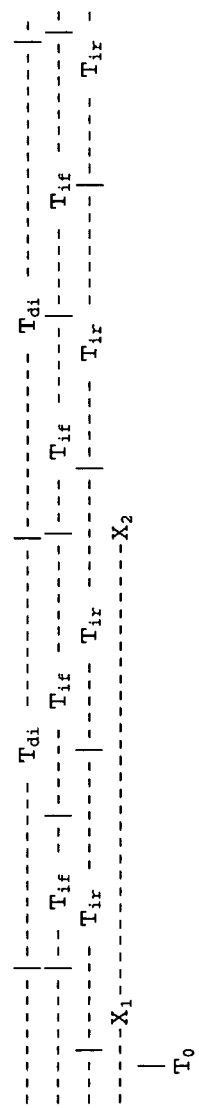
FIG. 5 is a timing diagram showing access time to a broadcast/multicast service for a terminal.

As shown in FIG. 5, if a terminal accesses the broadcast/multicast service at time $X_1$, the application will first be rendering the media earliest at time $X_2$. In FIG. 5, $T_0$=a time at which the decompressor has no dynamic context (or none at all); $T_{ir}$=the time between header compression periodical context refreshes (static and/or dynamic); $T_{di}$=the time between in-band codec access configuration information; and $T_{if}$=the time between independently coded media frames (variable). Had the compressor performed its context initialization or repair procedure based on the presence of an independently coded media frame and the codec configuration information (if sent in-band with the encoded media), the access time to the service would have been reduced. There is thus potential for optimization of such a service by performing synchronization of the sending of context initialization packets with the media characteristics, to improve access time to the service.

As explained earlier, a conventional compressor operating over a unidirectional link (e.g. ROHC in U-Mode) will normally send context initialization packets (e.g. ROHC IR packets) at periodic intervals, which interval is decided from the spectral efficiency—channel acquisition time trade-off.

Similarly, the media coding normally includes configuration information (e.g. MPEG-4 Visual Object Sequence Header, Visual Object Header and Video Object Layer Header), possibly also sent at periodic intervals (e.g. in a BCMCS streaming service). This information is necessary to initialize the decoder. Independently coded frames (e.g. MPEG-4 I frames) are also generated either at periodic intervals or based on the amount of variation within the original media. Other frames are encoded relatively to either a previous (P frames) or a previous and a later frame (B frames).

Figure 6:
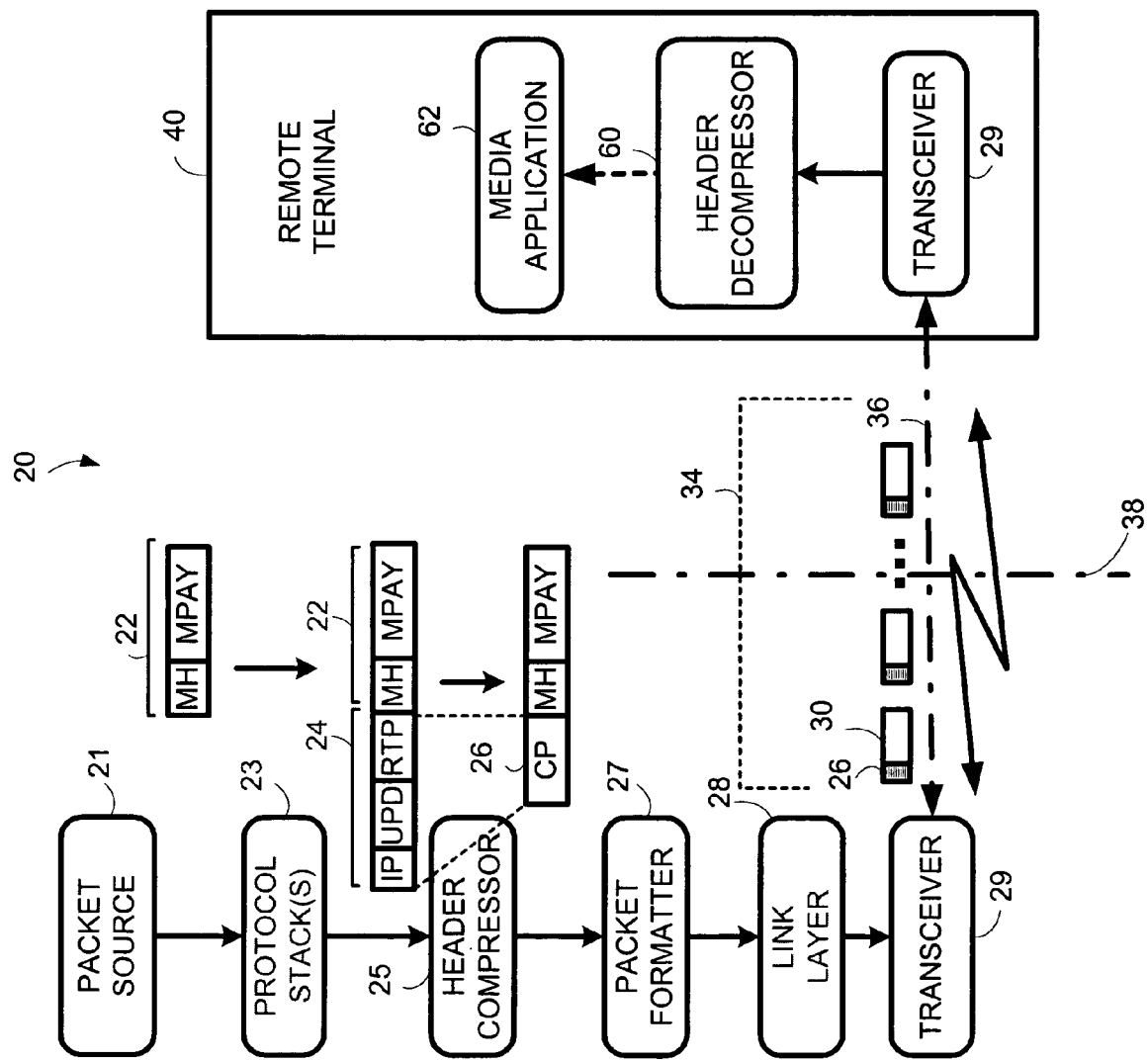
FIG. 6 is a diagrammatic view showing a generic telecommunications system which serves as an example context for illustrating techniques of controlling transmission of context information for header compression, and wherein the system includes an example header compressor.

FIG. 6 shows an example telecommunications network 20 wherein a stream of packets are supplied by a packet source 21. FIG. 6 shows, for example, a media packet 22 having a media payload (MPAY) and header (MH) being applied to a protocol stack 23. The particular protocols comprising the protocol stack can vary, and typically comprise an application protocol, under a transport protocol, under an Internet Protocol. In the particularly illustrated example, the protocol stacks 23 serve to affix protocol headers 24 (e.g., IP, UDP, and RTP) to the media packet 22. The media packet 22 with its appended protocol headers 24 is applied to a packet header compressor 25. The packet compressor 25 compresses the protocol headers 24, resulted in a compressed header 26 for the packet. The header compressor 25 performs header compression according to any of many suitable header compression algorithms, either conventional (such as ROHC or SigComp, for example) or otherwise.

After the header of the packet is compressed by header compressor 25, a packet formatter 27 incorporates the compressed header into a packet which is applied to a transceiver 29. The transceiver 29 serves to transmit the packet, such as packet 30 with its compressed header 26, in a flow 34 of packets over link 36 across an interface 38 to a remote terminal or unit 40. The flow 34 of packets, most with compressed headers, need not be continuous, but can instead be sporadic, depending on the type of packet service involved and the nature of the material included in the packet service (e.g., media type).

FIG. 6A shows that header compressor 25 can be situated at a network node, such as node 41. The header compressor 25 serves to compress headers of media packets received from media source 21 and sends context information to a decompressor for use by the decompressor in decompressing compressed headers of the media packets. As used herein, "context information" encompasses one or both of context initialization information and context refresh information. As further shown in FIG. 6A, the header compressor 25 includes a compressed header generator 44 and a context transmission controller 46. Optionally, compressed header generator 44 includes or has access to a source 47 of header static information and a source 48 of header dynamic information. While sources 47 and 48 have been shown in compressed header generator 44, it is also possible that the header static information and the header dynamic information may be present in packets incoming to the header compressor before actual compression. In such case, the static information, once a context exists, is both presenting the original uncompressed header before compression and in the context, e.g., in header static information source 47.

With regard to a flow of the media packets from the compressor 25 to the decompressor, context transmission controller 46 controls inclusion of the context information in the flow in accordance with a media characteristic of the media packets. Thus, header compressor 25 sends context information based on the type of media frame or its content, instead of blindly sending such context information based on a periodic interval, as it is normally the case (as in, e.g., RFC 3095 (Bormann, C., "RObust Header Compression (ROHC): Framework and four profiles: RTP, UDP, ESP, and uncompressed", RFC 3095, Internet Engineering Task Force, July 2001).

The media stream issuing from media source 21 of FIG. 6 can be realized in various ways. The media stream can either (1) be pre-recorded and sent by a server (in this case the media is already encoded); (2) come from a transcoder (which adapts the original media from a source to another media encoding potentially more suitable and/or supported by terminals); or (3) come from a source that performs real-time encoding of live media. Thus, the header compressor can receive an input media packet from any of several types of media sources 21 somewhere within the IP network. For most types of media, the payload portion MPAY itself has been encoded using any of various type of encoding techniques, such as (for example) MPEG-4). The header compressor 25, and particularly compressed header generator 44, compresses header portion 24 with the result that network node 41 sends an output packet 30 to a header decompressor 60. The output packet 30 includes, as its compressed header 26, a compressed version of header 24, as well as the payload portion MPAY of the corresponding input packet.

The compression by compressed header generator 44 of the header portion 26, which itself is an encoding process, is distinct from the encoding technique that was utilized to encode the media in the packet payload. As explained herein, however, the compressed header generator 44 can advantageously utilize characteristics of the encoded media to decide when it is time to send context information (e.g., IR/IR_DYN packets) or when it is time to lower the header compression ratio. In terms of its compression activities, the compressed header generator 44 can simply use the information inside the decompressed header, e.g., RTP headers; or can analyze the payload of the media packet; or can even base the compression on the size of the media payload (since, e.g., the larger size normally implies the presence of an independently coded media frame).

The output media packet 30 with its compressed header 26 forms but one packet in a flow or stream 34 of compressed packets being transmitted from the header compressor 25 to header decompressor 60. The flow 34 of media packets, most with compressed headers, need not be continuous, but can instead be sporadic, depending on the type of media service involved and the nature of the material included in the media service.

Figure 4:
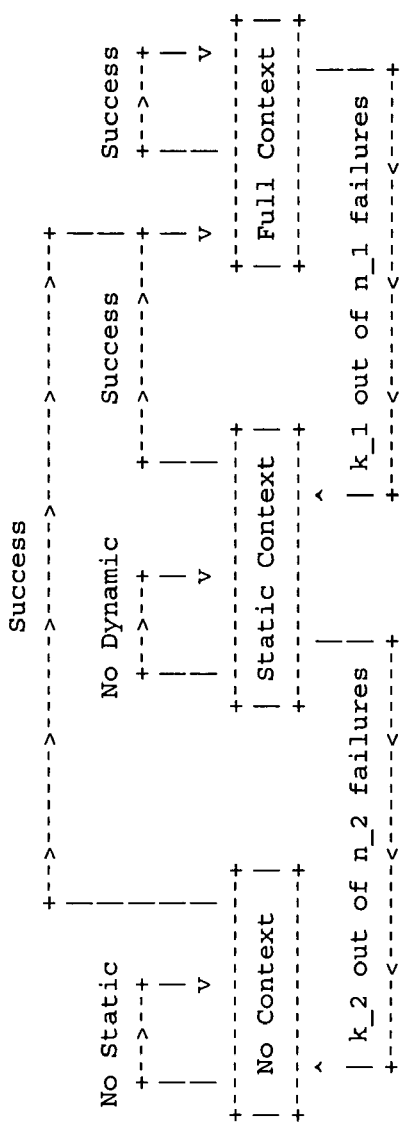
FIG. 4 is a diagrammatic view showing an example U-Mode decompressor state machine.

Header decompressor 60 operates essentially conventionally, e.g., operates in accordance with the state machine diagram of FIG. 4. Header decompressor 60 decompresses the compressed headers of the media packets received in flow 34, and then ultimately passes the media packets (now with decompressed headers) to an application 62 which utilizes the media packets. Assuming that the decompressor context has already been initialized and that the media decoder 62 has already been initialized, the rendering of the streamed media (audio and/or video) with header compression by media decoder 62 can begin when at least one independently encoded media frame has been received.

In the illustrated embodiment of FIG. 6A, the header decompressor 60 happens to be situated in a wireless remote terminal 70. As such, the remote terminal 70 receives radio frequency transmissions over an air or radio interface, depicted by dashed-dotted line 38 in FIG. 6A. Use of a wireless remote terminal 70 is consistent with, for example, the RFCs cited herein and incorporated by reference. Yet it will be appreciated that the header compression techniques described herein, including the timing or controlling of transmission of context information, are not limited to use with any particular type of remote terminal or terminal interface, and that the techniques can instead or additionally be utilized for transmissions that are not wireless, or are by types of radiation or waves other than radio waves.

In one non-limiting example embodiment, the header compressor 25 includes the context information in packets that are transmitted to header decompressor 60. The context transmission controller 46 particularly controls the timing of generation of the context information-laden packets. As used herein, control of timing of generation encompasses timing of inclusion of the context information-laden packets in the packet flow 34, and does not necessarily require that header compressor 25 actually format such packet or release such packet to any particular interface. The context information-laden packets, i.e., the packets which include the context information, may be included in the packet flow 34 to the decompressor 60 and may (in alternate embodiments) be either (1) packets which are separate and distinct from the media packets whose headers are being compressed, or (2) media packets which include the context information, e.g., include the context information as context information parameters in their headers.

In conjunction with the foregoing, the header compressor does not add or remove information, rather it decides what level of compression is most suitable, i.e., how "aggressively" it will try to compress the packet. For example, when the context transmission controller 46 encounters an input packet having therein an expression of media characteristic, the header compressor 25 may lower the compression ratio to the level prompted by such expression such that the compressed header of the corresponding output packet contains part or all of the static and/or dynamic context information prompted by such media characteristic. A compression/decompression context is information kept as state. The context includes, for example, the latest value of each fields of the protocol stack being compressed in uncompressed form, as well as control fields that may or may not be sent from time to time. There is also other information in the context, such as required by different coding methods used for compression (e.g. sliding windows for LSB coding, other reference values, etc). This state is used to compress and decompressed the information sent within compressed headers. So, if the compressor decides to not perform aggressive compression for packet containing certain characteristics in terms of the media they are transporting, then a "larger compressed" header will be sent with proper timing based on the payload of packet to header-compress. This "larger compressed" header normally contains most fields in uncompressed form and some values for a number of control fields, such that the amount of information is sufficient (or nearly) for an entire decompressor context to be "renewed", or reinitialized.

In one mode of operation, the predetermined characteristic which causes context transmission controller 46 to include the context information in flow 34 is media codec access information included in a payload of a packet whose header is intended to be compressed. Upon detection of the media codec access information, the compressor includes static parameters (obtained from header static information source 47) as the context information for the compression context. Such detection is facilitated, in an example embodiment, by a media characteristic analyzer unit or functionality 80 provided by or in conjunction with context transmission controller 46. In another mode of operation, the predetermined characteristic can be a type of media frame included in a payload of a packet, e.g., an independently encoded media frame, wherein the detection of the independently encoded media frame prompts inclusion of at least dynamic parameters (obtained from header dynamic information source 48) in the context information for the compression context. Again, such detection may be facilitated by media characteristic analyzer 80.

FIG. 6B shows a variation of the header compressor, particularly header compressor 25B wherein the compressed header generator 44 comprises an example state machine, e.g., header compression state machine 44B. In the FIG. 6B example embodiment, the header compression state machine 44B performs transitions among the following compression states: an initialization and refresh state (IR); a first order compression state (FO); and, a second order compression state (SO).

As explained previously, the initialization and refresh state (IR) initializes static parts of a compression context at the decompressor or is used for recovery after failure. In the initialization and refresh state (IR) the header compressor 25 sends complete header information (including all static and nonstatic fields in uncompressed form plus some additional information). The header compressor 25 stays in the IR state until it is fairly confident that the decompressor has received the static information correctly. In the first (or "lower") order compression state (FO), the header compressor 25 essentially communicates via the context information certain irregularities in the packet stream using, e.g., header dynamic information such as that obtained from source 48. In this case source 48 is the header of the packet itself. In the second (or "higher") order compression state (SO), compression is optimal.

Figure 7:
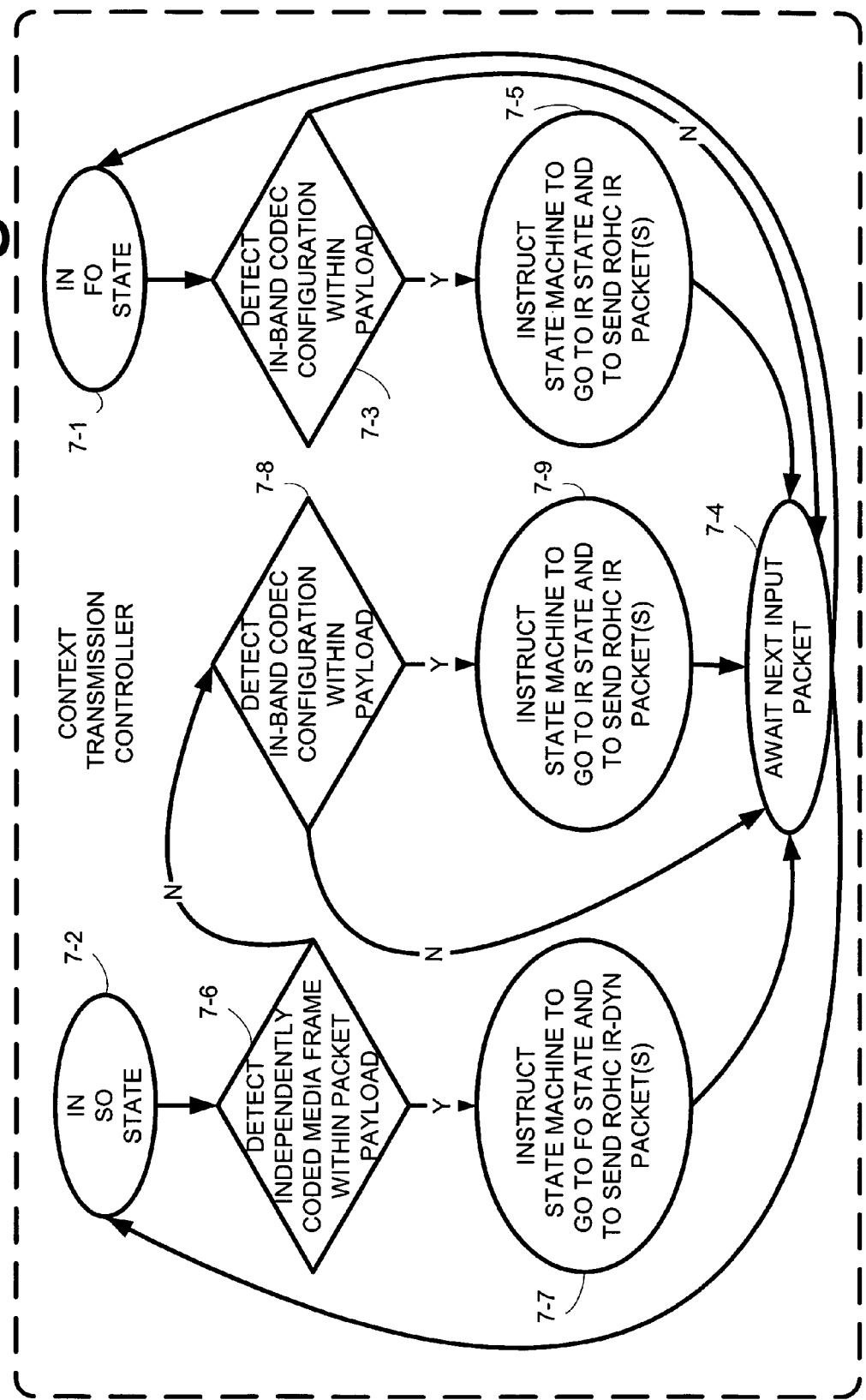
FIG. 7 is a flowchart showing basic, example, non-limiting operations performed by an example context transmission controller.

The header compressor 25B of the FIG. 6B embodiment also includes the context transmission controller 46 which, with regard to the flow 34 of the media packets, controls inclusion of the context information and thus, in the FIG. 6B embodiment, transition between the compression states in dependence upon a media characteristic of the media packets. In conjunction with operation of context transmission controller 46, FIG. 6B shows the input packet 49 being applied not only to header compression state machine 44B, but also to context transmission controller 46 and particularly to media characteristic analyzer 80. FIG. 7 shows basic, example, non-limiting operations or events performed or experienced by the context transmission controller 46 of the embodiment of FIG. 6B, from which operations of other embodiments can also be understood or deduced. The events or steps of FIG. 7 are essentially performed with respect to each input (media) packet applied to header compressor 25. Event 7-1 shows context transmission controller 46 being advised or becoming aware that header compression state machine 44B is in the first (or "lower") order compression state (FO). Alternatively, event 7-2 shows context transmission controller 46 being advised or becoming aware that header compression state machine 44B is in the second (or "higher") order compression state (SO). Operation of context transmission controller 46 thus begins with either event 7-1 (for first order compression state (FO)) or event 7-2 (for second order compression state (SO)).

Upon receipt of an input packet and being aware (event 7-1) that the header compression state machine 44B is in the first (or "lower") order compression state (FO), the context transmission controller 46 attempts to detect codec configuration information within the payload 52 of the input packet 49. In particular, as event 7-3 the characteristic analyzer 80 checks for codec configuration information with the payload 52 of the input packet 49. If codec configuration information is not detected within the payload 52, context transmission controller 46 awaits a notification or awareness of receipt or processing of a next input packet (as reflected by event 7-4). If it is determined at event 7-3 that codec configuration information is detected within the payload 52, as event 7-5 the context transmission controller 46 instructs the header compression state machine 44B to go to the IR state and to send context information (e.g., ROHC IR packet(s)) to header decompressor 60. After commissioning such actions, the context transmission controller 46 awaits a notification or awareness of receipt or processing of a next input packet (as again reflected by event 7-4).

Upon receipt of an input packet and being aware (event 7-1) that the header compression state machine 44B is in the second (or "lower") order compression state (FO), the context transmission controller 46 attempts to detect an indication or expression of a predetermined type of media frame within the payload 52 of the input packet 49. In particular, as event 7-6 the characteristic analyzer 80 checks for an indication or expression of an independently coded media frame with the payload 52 of the input packet 49. If it is determined at event 7-6 that an independently coded media frame is detected within the payload 52, as event 7-7 the context transmission controller 46 instructs the header compression state machine 44B to go to the first order (FO) state and to send context information (e.g., ROHC IR-DYN packet(s)) to header decompressor 60. After commissioning such actions, the context transmission controller 46 awaits a notification or awareness of receipt or processing of a next input packet (as again reflected by event 7-4).

On the other hand, if it is not determined at event 7-6 that an independently coded media frame is detected within the payload 52, as event 7-8 the context transmission controller 46 (e.g., media characteristic analyzer 80) attempts to detect codec configuration information within the payload 52 of the input packet 49. If codec configuration information is not detected within the payload 52, context transmission controller 46 awaits a notification or awareness of receipt or processing of a next input packet (as reflected by event 7-4). If it is determined at event 7-8 that codec configuration information is detected within the payload 52, as event 7-9 the context transmission controller 46 instructs the header compression state machine 44B to go to the IR state and to send context information (e.g., ROHC IR packet(s)) to header decompressor 60. After commissioning such actions, the context transmission controller 46 awaits a notification or awareness of receipt or processing of a next input packet (as again reflected by event 7-4).

It has been mentioned above that the header compression state machine 44B may go to the IR state and to send context information in the form of ROHC IR packets to header decompressor 60. In such event, more than one packet may be sent. It is possible for the compressor to decide to lower the compression ratio (i.e. to send IR) for a number of consecutive packets to prevent against packet losses and increase robustness of the header compression operation. However, if the first IR packet were to be lost over the air interface, such loss would mean that the independently coded frame (or, alternatively, the codec initiating information) is also lost. So in such case any repeating of IR packets for many consecutive packets will likely not improve the situation.

For purposes such as but not limited to the events of FIG. 7, the detection by an entity such as media characteristic analyzer 80 of an independently coded media frame with the payload 52 of the input packet 49 can be accomplished in various ways. For example, an expression or indication that the frame is an independently coded media frame can be acquired from a Payload Type (PT) Field of an RTP header included in payload 52 (see FIG. 8). Alternatively, without having to examine the RTP header, such expression or indication that the frame is an independently coded media frame can be associated with a bearer type (quality of service [QoS] class or a specific service (such as a specific Service Option [SO] identifier in a cdma2000 system. It can also be based on the size of the payload, as independently-coded frames are normally the largest ones, and potentially often of the same size.

An expression or indication that media codec information is included in the payload 52 can be inferred by inspecting initial octets of the RTP payload, depending on the type of media encoding utilized. Such expression or indication can also come from multiplexing using the RTP ports, where media access information is sent to a different port than pure media frames. In certain cases it can also be inferred from the RTP payload size or the size of the packet itself. It can also be associated to a system parameter such as a bearer type (quality of service [QoS] class or a specific service (such as a specific Service Option [SO] identifier in a cdma2000 system.

Figure 8:
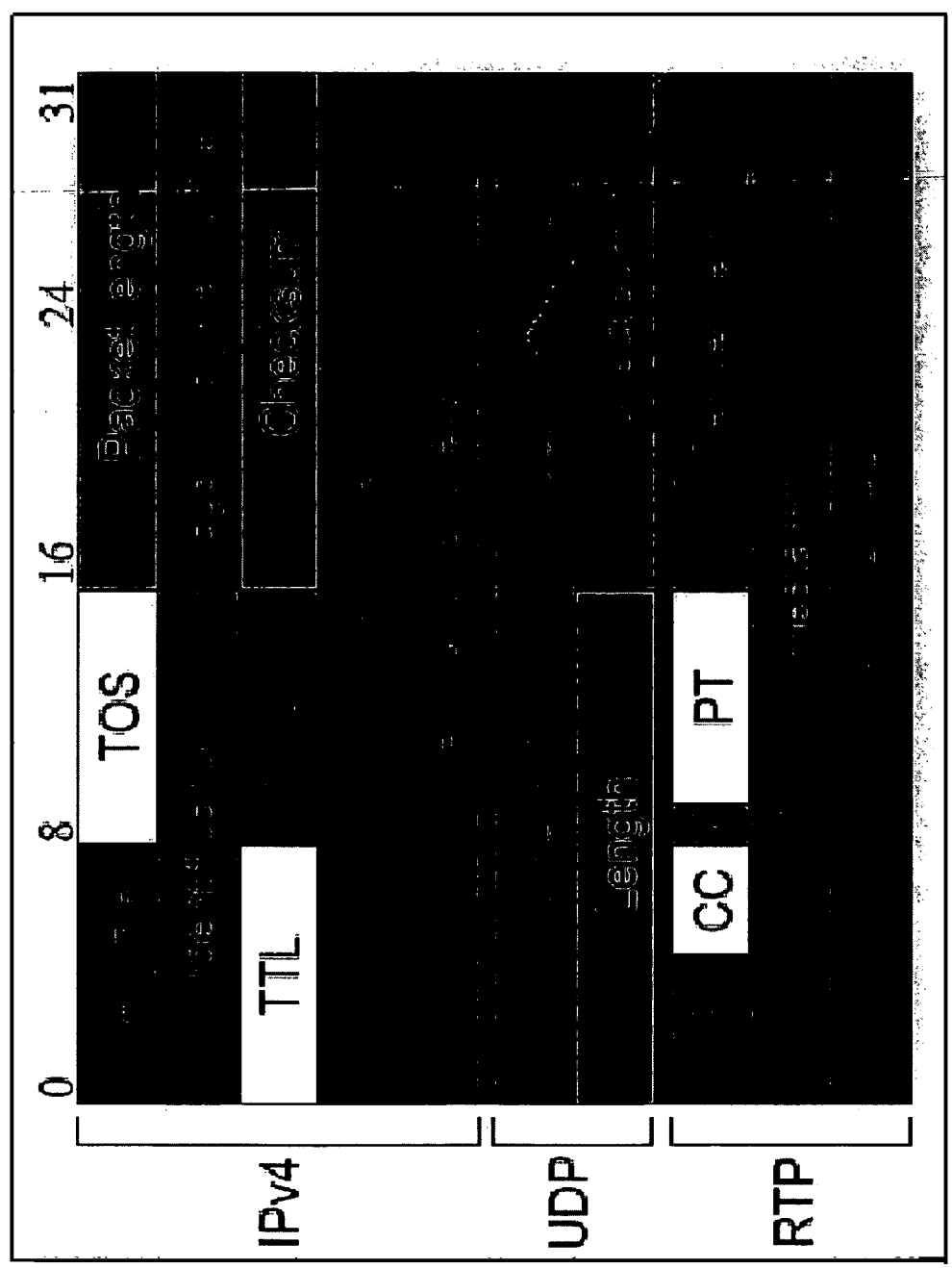
FIG. 8 is a diagrammatic view of an RTP header.

FIG. 8 illustrates an examples RTP header included in payload 52. Of the fields included in the RTP header, fields that are essentially static are the first two fields, as well as the "Fragment Offset", "Protocol", "Source Address", "Destination Address", "Source Port", "Destination Port", "V", "P", "X", and "SSRC Identifier" fields. Fields of the RTP header that can be inferred are "Packet Length", "Checksum" (IPv4), and "Length" fields. The fields of the RTP header that rarely change are the "TOS", "TTL", CC", and "PT" fields. The remaining fields ("Identification", "Checksum" (UDP), "M", "Sequence Number", and "Timestamp") are prone to change more frequently.

It will be appreciated that, although FIG. 7 shows event 7-6 being performed before event 7-8, either order of performance, or even simultaneous performance, is possible. Further, after awaiting a next input packet in state 7-4, the context transmission controller 46 transitions to either event 7-1 or event 7-2, as appropriate and as informed of the current state of header compression state machine 44B.

The alternative events or actions emanating from event 7-1 and event 7-2 of FIG. 7 can be independently implemented. That is, the context transmission controller 46 can perform the events emanating from event 7-1 without having to perform the events emanating from event 7-2, and vice versa.

Thus, as one of its aspects, the technology concerns a compressor which compresses headers of media packets destined to a decompressor, the compressor comprising a header compression state machine (which transitions between an initialization and refresh state and other states) and a context transmission controller. The context transmission controller governs transition to the initialization and refresh state upon detection of media codec configuration information within a payload of a packet, and preferably only upon detection of media codec configuration information within the payload of the packet. The compressor includes at least static parameters of a compression context in the header of the packet whose payload includes the media codec configuration information.

The header of the packet that carries at least the static parameters of the compression context is typically uncompressed, or has only certain portions thereof which are compressed. Portions of the context-laden packet header which can be compressed include, e.g., the IPV4 checksum and the IP length. Both of these parameters are normally removed since they can be recalculated on the decompressor side. This particular type of packet, while having a header which is compressed at least to some degree, is not decompressed using context on the decompressor side, but is instead decompressed using the information borne in the packet itself.

As another of its aspects, the technology concerns a compressor which compresses headers of media packets destined to a decompressor and which synchronizes a sending (encompasses both initialization and refreshing) to the decompressor of static and dynamic parameters of a compression context upon detection of a predetermined type of media frame within a payload of a packet. The compressor includes the dynamic parameters of the compression context in the header of the packet whose payload includes the independently encoded media frame. The dynamic part of the header of this packet is normally uncompressed (e.g., as for an IR-DYN packet type for ROHC), although (as mentioned previously) some parts of the header can be sent compressed (e.g., for large UOR-2 packet for ROHC).

The embodiments described herein can apply to or be utilized in conjunction with (but not limited to), e.g., a broadcast/multicast service, and media encoding and access characteristics as well as compressor behavior as described, e.g., in RFC 3095 and other references such as those incorporated herein.

Figure 10A:
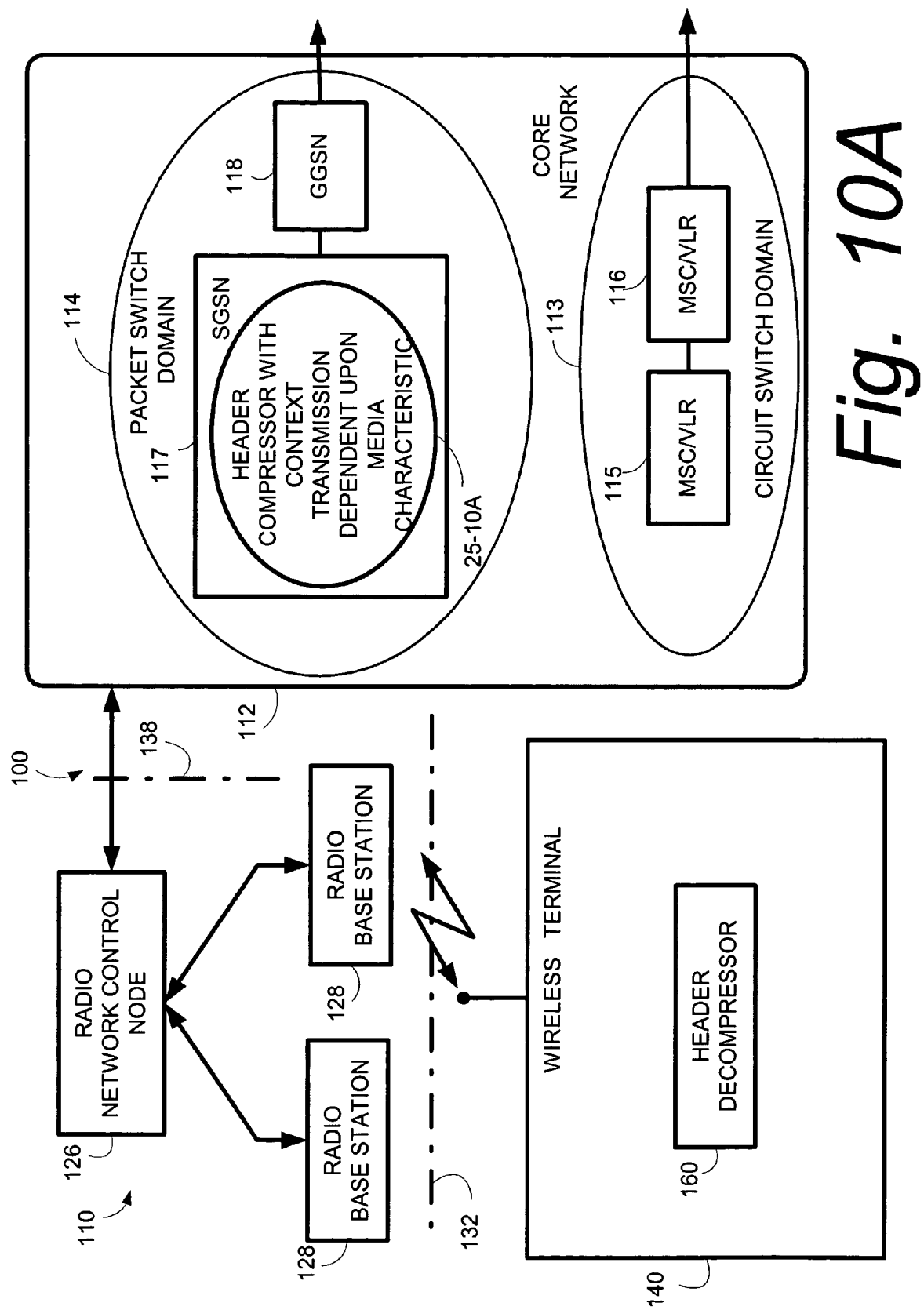
FIG. 10A is a schematic view of a particular telecommunications system which serves as an example context in which the present invention may be employed, wherein a compressor is included in a General Packet Radio Service (GPRS) Service (SGSN) node.

A non-limiting example environment of implementation of the foregoing network is a telecommunications network 100 such as that shown in FIG. 10A. The example telecommunications network 100 includes both a radio access network 110 and a core network 112. The core network 112 is shown as comprising a circuit switch domain 113 and a packet switch domain 114. In the particularly illustrated example, the circuit switch domain 113 (e.g., a PSTN/ISDN connection-oriented network) is shown as comprising a Mobile Switching Center (MSC)/Visiting Location Register node 115 and a Gateway MSC node 116. The packet switch domain 114 is illustrated in example fashion as including a General Packet Radio Service (GPRS) Service (SGSN) node 117 which is connected to a Gateway General Packet Radio Service (GPRS) support node (GGSN) 118.

Gateway GRPS support node (GGSN) 118 provides the interface towards the packet-switched networks (e.g., the Internet, X.25 external networks) and as such serves to translate data formats, signaling protocols and address information in order to permit communication between the different networks. Serving GPRS Support Node (SGSN) 117 provides packet routing to and from a SGSN service area, and serves GPRS subscribers which are physically located within the SGSN service area. Serving GPRS Support Node (SGSN) 117 provides functions such as authentication, ciphering, mobility management, charging data, and logical link management toward the user equipment unit. A GPRS subscriber may be served by any SGSN in the network depending on location. The functionality of Serving GPRS Support Node (SGSN) 117 and Gateway GRPS support node (GGSN) 118 may be combined in the same node, or may exist in separate nodes as shown in FIG. 10A.

In the FIG. 10A embodiment, the General Packet Radio Service (GPRS) Service (SGSN) node 117 of core network node 112 is also shown as hosting the header compressor 25-10A with its context transmission controller. The structure and operation of header compressor 25-10A is essentially similar to that of the generic, representative header compressor 25 described previously.

The core network 112 connects to radio access network 110 over a radio access network interface depicted by dot-dashed line 122. The radio access network 110 includes one or more control nodes 126 and one or more radio base stations (BS) 128. In an example, non-limiting implementation in which radio access network 110 is a UMTS Terrestrial Radio Access Network (UTRAN), the radio access network interface depicted by dot-dashed line 122 is known as the Iu interface, and the control nodes 126 take the form of radio network controllers (RNCs). The person skilled in the art understands the function and constituency of radio network control node 126, such as a diversity handover unit, controller(s), and various interfaces, for example. In other implementations of radio access network 110, the control nodes 126 can have other names, such as base station controller (BSC), radio network control node, etc. In any event, it should be understood that, for sake of simplicity, the radio access network 110 of FIG. 10A is shown with only one control node 126, with the control node 126 being connected to two base stations (BS) 128. As understood by those skilled in the art, the radio access network 110 typically has numerous control nodes 126, which can be connected over an unillustrated interface (such as an Iur interface).

Again for sake of simplicity, only two base station nodes 128 are shown connected to the representative control node 126. It will be appreciated that a different number of base stations 128 can be served by each control node 126, and that control nodes 126 need not serve the same number of base stations. Further, those skilled in the art will also appreciate that a base station is sometimes also referred to in the art as a radio base station, a node B, or B-node.

For brevity it is assumed in the ensuing discussion that each base station 128 serves one cell. It will be appreciated by those skilled in the art, however, that a base station may serve for communicating across the air interface for more than one cell. For example, two cells may utilize resources situated at the same base station site. Moreover, each cell may be divided into one or more sectors, with each sector having one or more cell/carriers.

A wireless terminal 170 communicates with one or more cells or one or more base stations (BS) 128 over a radio or air interface 138. In differing implementations, the wireless terminal 170 can be known by different names, such as remote terminal, mobile station or MS, mobile terminal or MT, or user equipment unit (UE), for example. Of course, whereas for ease of illustration only one wireless terminal 170 shown in FIG. 10A, each base station typically serves many wireless terminals.

In the example UMTS implementation mentioned above, radio access is preferably based upon Wideband, Code Division Multiple Access (WCDMA) with individual radio channels allocated using CDMA spreading codes. Of course, other access methods may be employed.

The wireless terminal 170 has a header decompressor 160. The structure and operation of wireless terminal 170 and of header decompressor are understood by those skilled in the art, including the structure and operation of a constituent transceiver, protocol stacks, decoders, buffers, and media rendering applications or the like.

In the FIG. 10B embodiment, the Gateway General Packet Radio Service (GPRS) support node (GGSN) 118 is shown as hosting the header compressor 25-10B, instead of the hosting being at the SGSN 117. The structure and operation of header compressor 25-10B is essentially similar to that of the generic, representative header compressor 25 described previously.

Figure 10C:
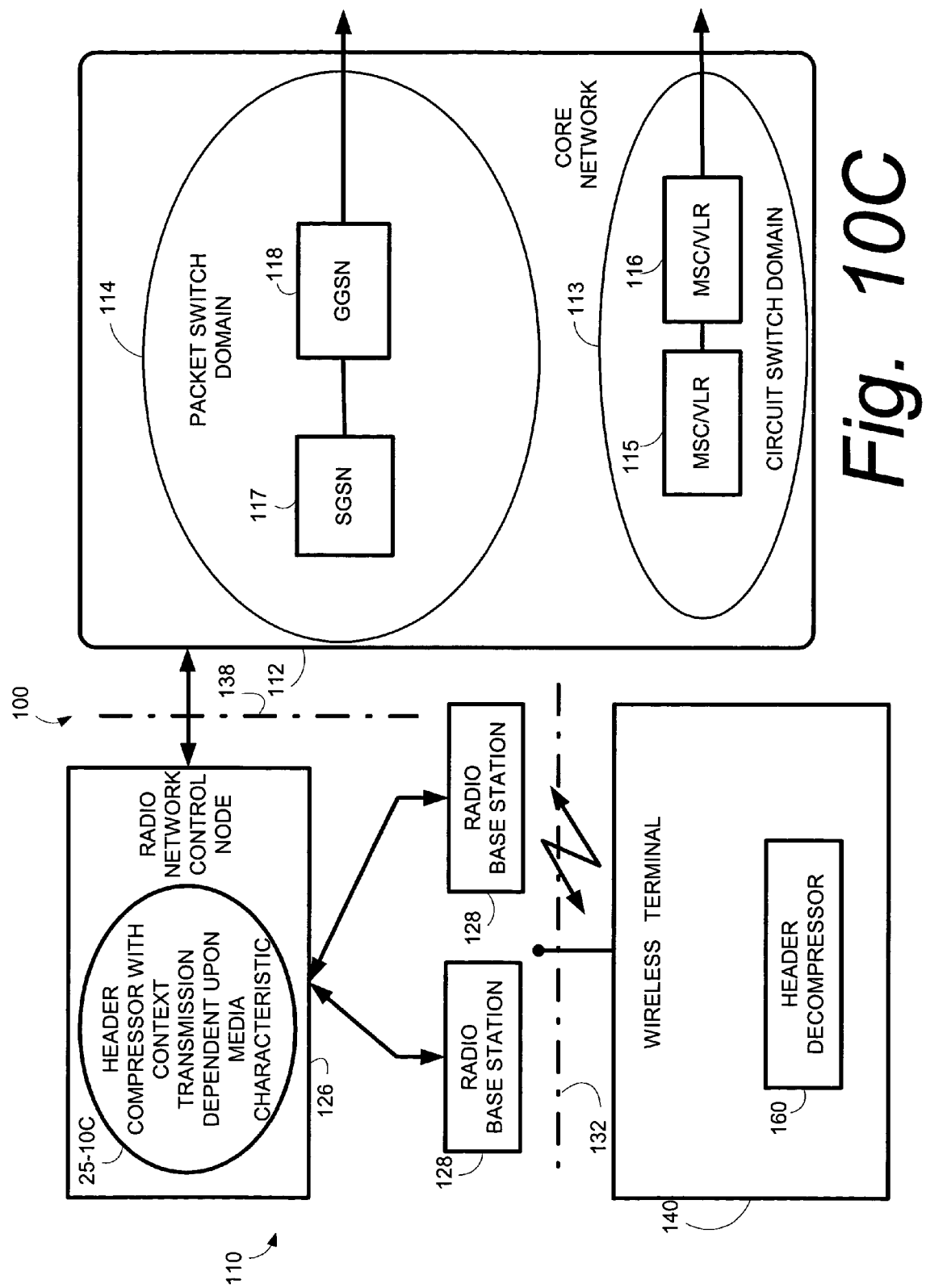
FIG. 10C is a schematic view of a particular telecommunications system which serves as an example context in which the present invention may be employed, wherein a compressor is included in radio network controller (RNC).

In the FIG. 10C embodiment, radio network controller node 126 is shown as hosting the header compressor 25-10C, instead of one of the core network nodes. The structure and operation of header compressor 25-10C is essentially similar to that of the generic, representative header compressor 25 described previously.

While nodes such as those illustrated in FIG. 10A, FIG. 10B, and FIG. 10C have myriad other elements and functionalities, as understood by the person skilled in the art, illustrated herein are only those elements and functionalities necessary or helpful for illustrating the context information transmission techniques described herein. In the cdma2000 architecture, the SGSN/GGSN is a PDSN (Packet Data Serving Node) which serves similar purposes.

The header compressor 25 is generically shown in the various illustrated embodiments as function blocks. Those skilled in the art will appreciate that the functions of header compressor 25, and the sub-functions thereof, may be implemented using individual hardware circuits, using software functioning in conjunction with a suitably programmed digital microprocessor or general purpose computer or processors/co-processors/specialized processors, using an application specific integrated circuit (ASIC), and/or using one or more digital signal processors (DSPs).

The header compressors described herein with their attendant context transmission controllers achieve access delay improvement by having the compressor performing the downward transition from the SO state (to IR state or FO state) upon detecting either independently coded media frames and/or in-band codec configuration information.

Various ones of the header compressors described herein, when operating in the unidirectional mode, function in accordance with and/or achieve the following:

The transition from the higher compression state (e.g. ROHC SO state) to a lower compression state (e.g. ROHC FO state) is based on the type of encoded frame for the media carried within the payload of the packet to be header compressed. Dynamic (and static) header information is sent as part of the compressed packet (e.g. ROHC IR-DYN, or IR packet).

The transition from the higher compression state (e.g. ROHC SO state) or from a lower compression state (e.g. ROHC FO state) to the initialization state (e.g. ROHC IR state) is based on the presence of media codec access information carried within the payload of the packet to be header compressed. Dynamic and static header information is sent as part of the compressed packet (e.g. ROHC IR packet). 3095

The compressor may not perform the state transition to the initialization state based on the periodic timeout, that is Timeout_1 may be infinite as long as the presence of media codec access configuration information is detected within the payload with an acceptable frequency. In this regard, FIG. 6B shows by broken arrow 80 the ability of context transmission controller 46 to affect the value of Timeout_1. The lowest frequency limit can normally be configured, either based on the type of service or simply from the implementation. The upper limit (higher frequencies) stems from the media source itself (e.g., for video, the more frequent the scene changes, the more frequent the occurrence of independently coded frames).

The compressor may not perform the state transitions away from the higher compression state based on the periodic timeout, that is Timeout_2 may be infinite as long as the presence of independently coded frames is detected within the payload with an acceptable frequency. In this regard, FIG. 6B shows by broken arrow 82 the ability of context transmission controller 46 to affect the value of Timeout_2.

For example, a compressor could transit to the FO state and send dynamic header information (e.g. ROHC IR-DYN packets, or large UOR-2 packets) when detecting the presence of independently coded media frames (e.g. MPEG-4 I-frames) within the packet payload.

A compressor could transit to the initialization state and send static (and dynamic) header information (e.g. ROHC IR packets) when detecting the presence of in-band codec configuration information (e.g. MPEG-4 Configuration information) within the packet payload.

This can be detected either from the length of the packet to be compressed (since independently coded frames are normally larger) or by simply inspecting the application protocol headers (RTP, or media headers inside the application header).

The header compressors disclosed herein perform context initialization and context repairs more efficiently, and remove the need for blindly performing periodic updates (Timeout_1 and Timeout_2 can be set to infinite) in multicast/broadcast services. This is made possible from the fact that the media characteristic itself provides useful hints for the compressor to perform these updates in a more suitable manner.

The net result of this procedure and the techniques herein disclosed is that delay towards accessing the service and delays towards recovery of the service after decompressor context damage are minimized.

Figure 9:
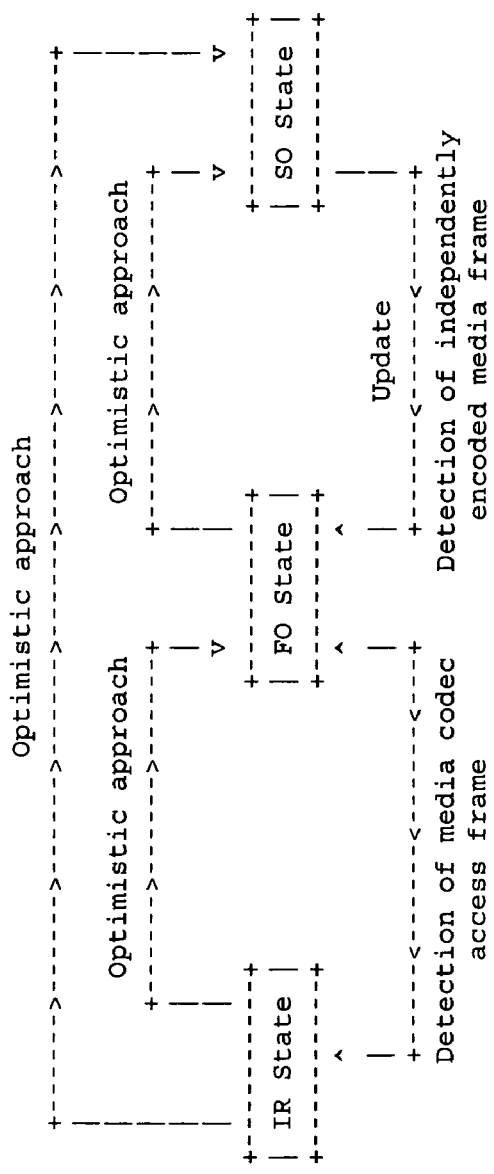
FIG. 9 is a diagrammatic view of an example state machine for a U-mode.

An example of the resulting state machine for U-mode is as shown in FIG. 9.

Finally, it should be noted that even if the generic terms "header compression", "header compressor" and "(header) decompressor" are used to show that the applicability of this idea is not limited to any specific header compression scheme. In particular, the idea is certainly applicable to environments and applications such as those described by the following (all of which are incorporated herein by reference):

Van Jacobson. *Compressing TCP/IP Headers for Low-Speed Serial Links*. IETF RFC 1144, IETF Network Working Group, February 1990.

Mikael Degermark, Björn Nordgren, Stephen Pink. *IP Header Compression*, IETF RFC 2507, IETF Network Working Group, February 1999.

Steven Casner, Van Jacobson. *Compressing IP/UDP/RTP Headers for Low-Speed Serial Links*, IETF RFC 2508, IETF Network Working Group, February 1999.

Koren, T., Casner, S., Geevarghese, J., Thompson B. and P. Ruddy, *Enhanced Compressed RTP (CRTP) for Links with High Delay, Packet Loss and Reordering*. IETF RFC 3545, IETF Network Working Group, July 2003

Carsten Bormann, et al. *RObust Header Compression (ROHC): Framework and four profiles: RTP, UDP, ESP and uncompressed*; IETF RFC 3095, April 2001.

Jonsson, L. and G. Pelletier, *RObust Header Compression (ROHC): A Link-Layer Assisted ROHC Profile for IP/UDP/RTP*, IETF RFC 3242, April 2002 ["ROHC LLA"].

Liu, Z and K. Le, *Zero-byte Support for Bidirectional Reliable Mode (R-mode) in Extended Link-Layer Assisted RObust Header Compression (ROHC) Profile*, IETF RFC 3408, December 2002).

Jonsson, L. and G. Pelletier, *RObust Header Compression (ROHC): A compression profile for IP*, IETF RFC 3843, June 2004.

IP/TCP headers (described in: Pelletier, G., Jonsson, L., West, M. and R. Price *RObust Header Compression (ROHC): TCP/IP Profile (ROHC-TCP)*, Internet Draft (work in progress), <draft-ietf-rohc-tcp-08.txt>, October 2004) ["ROHC TCP"]

IP/UDP-Lite/RTP headers (described in: Pelletier, G., *RObust Header Compression (ROHC): Profiles for UDP-Lite*, Internet Draft (work in progress), <draft-ietf-rohc-udp-lite-04.txt>, June 2004).

The structure and techniques herein described improve the access time to IP broadcast/multicast services (BCMCS) when using header compression over a unidirectional bearer. The header compressor performs synchronization between full header updates and the characteristics of the media contained within the packet to be compressed. This minimizes the delay required for the decompressor in the remote terminal to reach the Full Context (FC) state when joining the channel and after severe context damage to the dynamic part of the context. In addition, the techniques can be used to maximize the spectral efficiency of broadcast and multicast IP services by reducing the overhead incurred from the periodic sending of larger IR packets.

The access time to the service using unidirectional header compression is dependent on the time it takes to successfully obtain the static part of the context and begin decompression of compressed headers. The start of the application rendering the media depends on the time it takes for the decoder to receive its configuration information as well as the first independently coded frame. By synchronizing these steps, the latency before the service is accessed from the user perspective may be significantly improved in some cases.

These techniques are particularly useful for one-to-many applications sent over multicast or broadcast radio channels (such as video streaming, or such as a Push-to-talk VoIP application). These techniques are is also very relevant to the BroadCast MultiCast Services (BCMCS) currently being defined in 3GPP2 by the BCMCS ad-hoc group (TSG-X). These techniques are also useful for 3GPP's MBMS work item and in [GSM-AXIP], if ROHC operating in U-Mode is used. See, for example, the following (all of which are incorporated herein by reference): 3GPP2 cdma2000 BCMCS: C.S0054-0—cdma2000 High Rate Broadcast-Multicast Packet Data Air Interface Specification link: http://www.3gpp2.org/Public_html/specs/C.S0054-0_v1.0_021704.pdf, S.R0030—Broadcast/Multicast Services—Stage 1, Revision A link: http://www.3gpp2.org/Public_html/specs/S.R0030-A_v1.0_012004.pdf 3GPP MBMS: 3GPP TS 26.346 Multimedia Broadcast/Multicast Service (MBMS); Protocols and codecs link to references: http://www.3gpp.org/ftp/Specs/html-info/26346.htm).

This method also has the advantage of not requiring any change to any of the ROHC standards.

It should also be understood that the header compression techniques described herein, including the timing or controlling of transmission of context information, need not be performed at nodes or terminals identically structured as those herein illustrated and/or described. Rather, various functions such as non-compression functions and non-decompression functions can be distributed or separated to other nodes or devices, or even networks (e.g., core network and radio access network). Moreover, even the header compression functions and the decompression functions can be distributed over plural nodes and/or devices, if desired.

In view, e.g., of the foregoing, the term "network node" as employed herein refers to any node or unit, or portion of node or unit, which performs, either in whole or in part, the context information transmission control described herein.

Moreover, reference to the network node which includes the header compressor 25 as "sending" context information does not require that the header compressor 25 actually generate a mediate and/or immediate container (e.g., a packet) for the context information, or that the header compressor 25 actually transmit the context information over any particular interface en route to the remote terminal 70. Rather, such mention refers more generally to the fact that the node or device which hosts header compressor 25 is involved in controlling the timing of inclusion of the context information in the flow 34 that is at least eventually transmitted over the air interface (possibly through one or more downstream nodes or networks).

Further, the node or device which hosts the header compressor 25 may or may not be located more than one node or network interface away from a receiving entity such as remote terminal 70. For example, mention herein that context information is sent over an air or radio interface to a receiving entity (e.g., remote terminal 70) does not require that the header compressor 25 be situated in a node or location which borders the radio interface.

In view, e.g., of its discussion of header compression, simultaneously-filed U.S. patent application Ser. No. 10/987, 218, entitled "METHOD AND APPARATUS FOR HANDLING OUT-OF-SEQUENCE PACKETS IN HEADER DECOMPRESSION", is incorporated herein by reference in its entirety.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A compressor which compresses headers of media packets destined to a decompressor, the compressor comprising:
   a header compression state machine which transitions between an initialization and refresh state and other states, and wherein in the initialization and refresh state context information sent to the decompressor comprises static header information and dynamic header information;
   a context transmission controller which governs transition to the initialization and refresh state upon detection of media codec configuration information within a payload of a packet and which, upon the detection of the media codec configuration information within the payload, the context transmission controller sends the static header information and the dynamic-header information to the decompressor and transitions to the initialization and refresh state.

2. A header compression method comprising:
   compressing headers of media packets destined to a decompressor using a header compression state machine which transitions between an initialization and refresh state and other states, and wherein in the initialization and refresh state context information sent to the decompressor comprises static header information and dynamic header information;
   governing transition to the initialization and refresh state upon detection of media codec configuration information within a payload of a packet;
   upon the detection of the media codec configuration information within the payload, a context transmission controller sends the static header information and the dynamic header information to the decompressor and transitions to the initialization and refresh state.

3. A compressor which compresses headers of media packets and which sends context information to a decompressor for use by the decompressor in decompressing compressed headers of the media packets, the compressor comprising:
   a header compression state machine which transitions between the following compression states:
   an initialization and refresh state in which context information sent to the decompressor comprises static header information and dynamic header information;
   a first order compression state in which context information sent to the decompressor comprises dynamic header information;
   a second order compression state;
   a context transmission controller configured to use a media characteristic of media in a payload of the media packets to control inclusion of context information in headers of a flow of the media packets and to control transition between the compression states in dependence upon the media characteristic of the media packets;
   wherein the context information is used to compress or decompress subsequent packets and is either (1) the static header information and the dynamic header information that is sent to the decompressor in the initialization and refresh state or (2) the dynamic header information sent that is sent to the decompressor in the first order compression state.

4. The apparatus of claim 3, wherein when the context transmission controller of the compressor detects a predetermined characteristic of a media packet, the compressor includes the context information in a packet header.

5. The apparatus of claim 4, wherein the predetermined characteristic is a type of media frame included in a payload of a packet.

6. The apparatus of claim 5, wherein the predetermined characteristic is an independently encoded media frame included in a payload of a packet.

7. The apparatus of claim 4, wherein the predetermined characteristic is media codec access information included in a payload of a packet.

8. The apparatus of claim 3, wherein when the header compression state machine is in the second order compression state and the context transmission controller detects an independently encoded media frame within a payload of a packet, the header compression state machine transitions to the first order compression state.

9. The apparatus of claim 3, wherein when the header compression state machine is in the second order compression state and the context transmission controller detects an independently encoded media frame within a payload of a packet, the header compression state machine transitions to the first order compression state and includes at least dynamic header information in the context information.

10. The apparatus of claim 3, wherein when the header compression state machine is in either the first order compression state or the second order state and the context transmission controller detects media codec access information within a payload of a packet, the header compression state machine transitions to the initialization and refresh state.

11. The apparatus of claim 3, wherein when the header compression state machine is in either the first order compression state or the second order state and the context transmission controller detects media codec access information within a payload of a packet, the header compression state machine transitions to the initialization and refresh state and includes at least static header information in the context information.

12. A header compressor method comprising:
compressing headers of media packets;
utilizing a header compression state machine which transitions between the following compression states:
an initialization and refresh state in which context information sent to a decompressor comprises static header information and dynamic header information;
a first order compression state in which context information sent to a decompressor comprises dynamic header information;
a second order compression state;
using a media characteristic of media in a payload of the media packets to control inclusion of context information in headers of a flow of the media packets and to control transition between the compression states in dependence upon the media characteristic of the media packets;
wherein the context information is used to compress or decompress subsequent packets and is either (1) the static header information and the dynamic header information that is sent to the decompressor in the initialization and refresh state or (2) the dynamic header information sent that is sent to the decompressor in the first order compression state.

13. The method of claim 12, further comprising, upon detecting a predetermined characteristic of a media packet, including the context information in a header of a packet.

14. The method of claim 13, wherein the predetermined characteristic is a type of media frame included in a payload of a packet.

15. The method of claim 14, wherein the predetermined characteristic is an independently encoded media frame included in a payload of a packet.

16. The method of claim 13, wherein the predetermined characteristic is media codec access information included in a payload of a packet.

17. The method of claim 12, wherein when the header compression state machine is in the second order compression state, the method comprises detecting an independently encoded media frame within a payload of a packet and in response thereto transitioning to the first order compression state.

18. The method of claim 12, wherein when the header compression state machine is in the second order compression state, the method comprises detecting an independently encoded media frame within a payload of a packet and in response thereto transitioning to the first order compression state and including at least dynamic header information in the context information.

19. The method of claim 12, wherein when the header compression state machine is in either the first order compression state or the second order state, the method further comprises detecting media codec access information within a payload of a packet and in response thereto transitioning to the initialization and refresh state.

20. The method of claim 12, wherein when the header compression state machine is in either the first order compression state or the second order state, the method further comprises detecting media codec access information within a payload of a packet and in response thereto transitioning to the initialization and refresh state and including at least static header information in the context information.

21. The method of claim 12, wherein the context information comprises information which is used to decompress the packet and to maintain consistency between the state machines, and which can later be used to compress or decompress subsequent packets.

22. A compressor which compresses headers of media packets destined to a decompressor, the compressor comprising:
a header compression state machine which transitions between:
an initialization and refresh state in which context information sent to a decompressor comprises static header information and dynamic header information;
a first order compression state in which context information sent to a decompressor comprises dynamic header information;
a second order compression state;
a context transmission controller configured to govern transition to the initialization and refresh state upon detection of an independently coded media frame within a payload of a packet and, upon the detection of the independently coded media frame within the payload, the context transmission controller sends context information to the decompressor;
wherein the context information can be used to compress or decompress subsequent packets and is either (1) the static header information and the dynamic header information that is sent to the decompressor in the initialization and refresh state or (2) the dynamic header information sent that is sent to the decompressor in the first order compression state.

23. A header compression method comprising:
compressing headers of media packets;
utilizing a header compression state machine which transitions between the following compression states:
an initialization and refresh state in which context information sent to a decompressor comprises static header information and dynamic header information;
a first order compression state in which context information sent to a decompressor comprises dynamic header information;
a second order compression state;
governing transition to the initialization and refresh state upon detection of an independently coded media frame within a payload of a packet;
upon the detection of the independently coded media frame within the payload, a context transmission controller sends context information to the decompressor;
wherein the context information is used to compress or decompress subsequent packets and is either (1) the static header information and the dynamic header information that is sent to the decompressor in the initialization and refresh state or (2) the dynamic header information sent that is sent to the decompressor in the first order compression state.

* * * * *

UNITED STATES PATENT AND TRADEMARK OFFICE
CERTIFICATE OF CORRECTION

| | | |
|---|---|---|
| PATENT NO. | : 7,817,628 B2 | Page 1 of 1 |
| APPLICATION NO. | : 10/987219 | |
| DATED | : October 19, 2010 | |
| INVENTOR(S) | : Pelletier et al. | |

It is certified that error appears in the above-identified patent and that said Letters Patent is hereby corrected as shown below:

On the Face Page, in Field (56), under "OTHER PUBLICATIONS", in Column 1, Line 1, delete "al.." and insert -- al., --, therefor.

In Column 18, Line 60, delete "GRPS" and insert -- GPRS --, therefor.

In Column 19, Line 7, delete "GRPS" and insert -- GPRS --, therefor.

In Column 20, Line 62, delete "packet). 3095" and insert -- packet) 3095. --, therefor.

Signed and Sealed this
Sixteenth Day of August, 2011

David J. Kappos
*Director of the United States Patent and Trademark Office*